United States Patent

Matsuzaki

(10) Patent No.: US 9,779,782 B2
(45) Date of Patent: Oct. 3, 2017

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Takanori Matsuzaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/955,794

(22) Filed: Dec. 1, 2015

(65) Prior Publication Data

US 2016/0163358 A1 Jun. 9, 2016

(30) Foreign Application Priority Data

Dec. 8, 2014 (JP) ................................. 2014-247725

(51) Int. Cl.
*G11C 7/02* (2006.01)
*G11C 5/14* (2006.01)
(Continued)

(52) U.S. Cl.
CPC ................ *G11C 7/02* (2013.01); *G11C 5/147* (2013.01); *G11C 7/16* (2013.01); *G11C 11/24* (2013.01);
(Continued)

(58) Field of Classification Search
CPC .................................. G11C 7/02; G11C 5/147
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Hoai V Ho
*Assistant Examiner* — Muna A Techane
(74) *Attorney, Agent, or Firm* — Fish & Richardson P.C.

(57) ABSTRACT

In a configuration including a memory cell that retains multilevel data by controlling the on/off state of a transistor, correct data can be read out even if a potential of data retained by turning off the transistor is changed. The memory cell controls writing or retention of data corresponding to one of a plurality of potentials by controlling an on/off state of the transistor. The write voltage generator circuit outputs a first write voltage of data to be written to the memory cell. The write voltage generator circuit obtains a read voltage of the data by reading the first write voltage written to the memory cell. The write voltage generator circuit generates a second write voltage by correcting a change of the first write voltage caused by turning off the transistor, and outputs the second write voltage to the memory cell.

18 Claims, 16 Drawing Sheets

(51) Int. Cl.

| | | |
|---|---|---|
| *H01L 29/786* | (2006.01) | |
| *H01L 27/12* | (2006.01) | |
| *H01L 29/78* | (2006.01) | |
| *H01L 29/16* | (2006.01) | |
| *H01L 29/24* | (2006.01) | |
| *G11C 11/24* | (2006.01) | |
| *G11C 7/16* | (2006.01) | |
| *G11C 11/403* | (2006.01) | |
| *G11C 11/405* | (2006.01) | |
| *G11C 29/02* | (2006.01) | |

(52) U.S. Cl.
CPC .......... *G11C 11/403* (2013.01); *G11C 11/405* (2013.01); *G11C 29/021* (2013.01); *G11C 29/028* (2013.01); *H01L 27/1207* (2013.01); *H01L 29/16* (2013.01); *H01L 29/24* (2013.01); *H01L 29/78* (2013.01); *H01L 29/7869* (2013.01)

(58) Field of Classification Search
USPC ...................................................... 365/189.09
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,339,828 | B2 | 12/2012 | Yamazaki et al. |
| 8,358,530 | B2 | 1/2013 | Kamata |
| 8,363,452 | B2 | 1/2013 | Yamazaki et al. |
| 8,411,480 | B2 | 4/2013 | Nagatsuka et al. |
| 8,520,426 | B2 | 8/2013 | Onuki |
| 8,542,528 | B2 | 9/2013 | Sekine et al. |
| 8,569,753 | B2 | 10/2013 | Isobe et al. |
| 8,614,916 | B2 | 12/2013 | Nagatsuka et al. |
| 8,634,228 | B2 | 1/2014 | Matsuzaki et al. |
| 8,686,415 | B2 | 4/2014 | Kamata |
| 8,792,284 | B2 | 7/2014 | Ohnuki |
| 8,848,464 | B2 | 9/2014 | Sekine et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0101351 | A1* | 5/2011 | Yamazaki .............. G11C 11/405 257/57 |
| 2012/0033488 | A1* | 2/2012 | Nagatsuka .......... G11C 16/0433 365/149 |
| 2012/0287700 | A1 | 11/2012 | Takemura |
| 2014/0269099 | A1* | 9/2014 | Nagatsuka .......... G11C 16/0441 365/185.23 |
| 2014/0286073 | A1* | 9/2014 | Onuki .................... G11C 11/403 365/63 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 08-264794 A | 10/1996 |
|----|-------------|---------|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-209402 | 11/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.n. et al., "Spinel,YbFe2O4, and Yb2Fe3O7 Types of Structures for Compounds in the In2O3 and Sc2O3—A2O3—BO Systems [A; Fe, Ga, OR Al; B: Mg, Mn, Fe, Ni, Cu,OR Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tadem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amporphous In—Ga—Zn-Oxide TFTs", IDW '-9 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

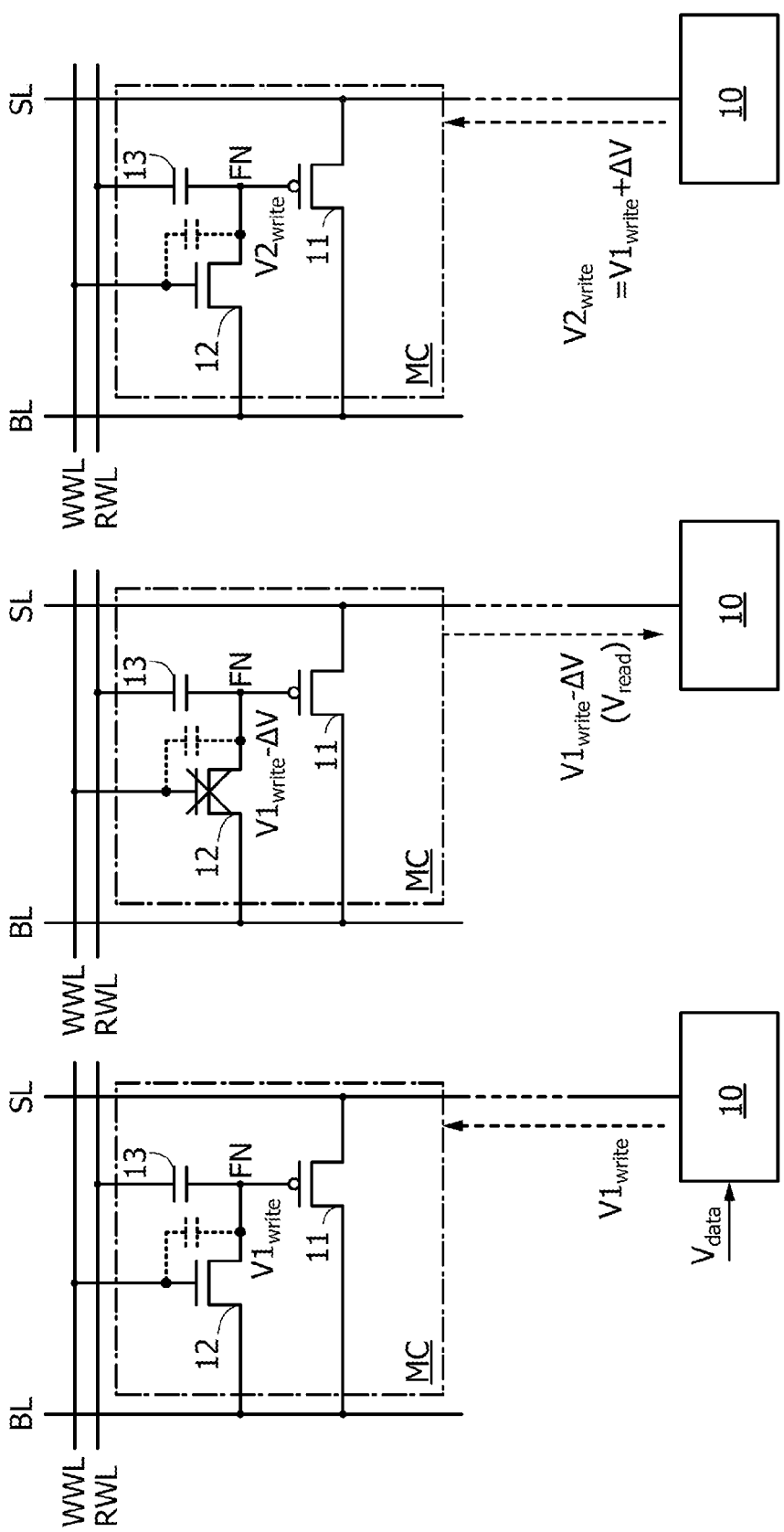

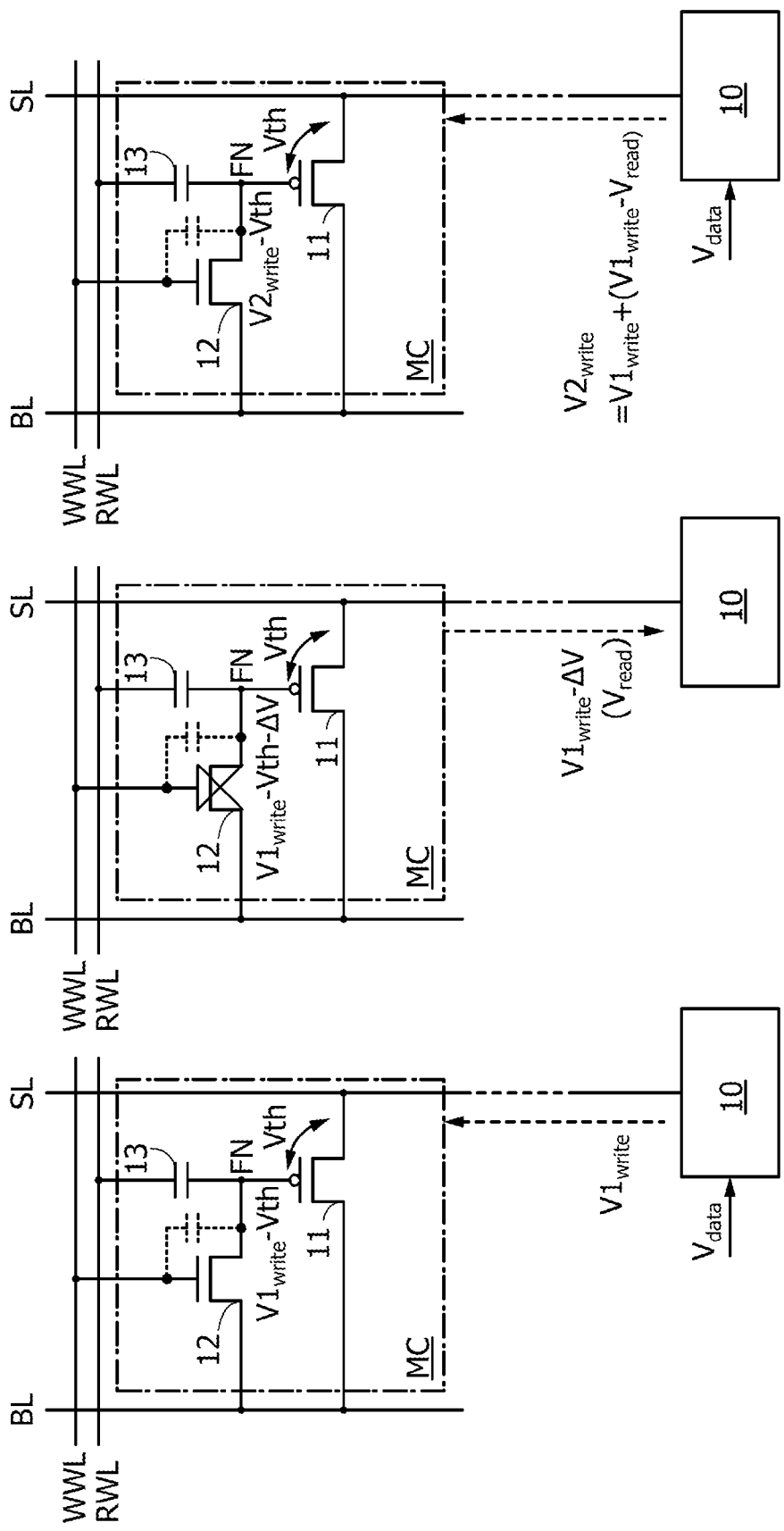

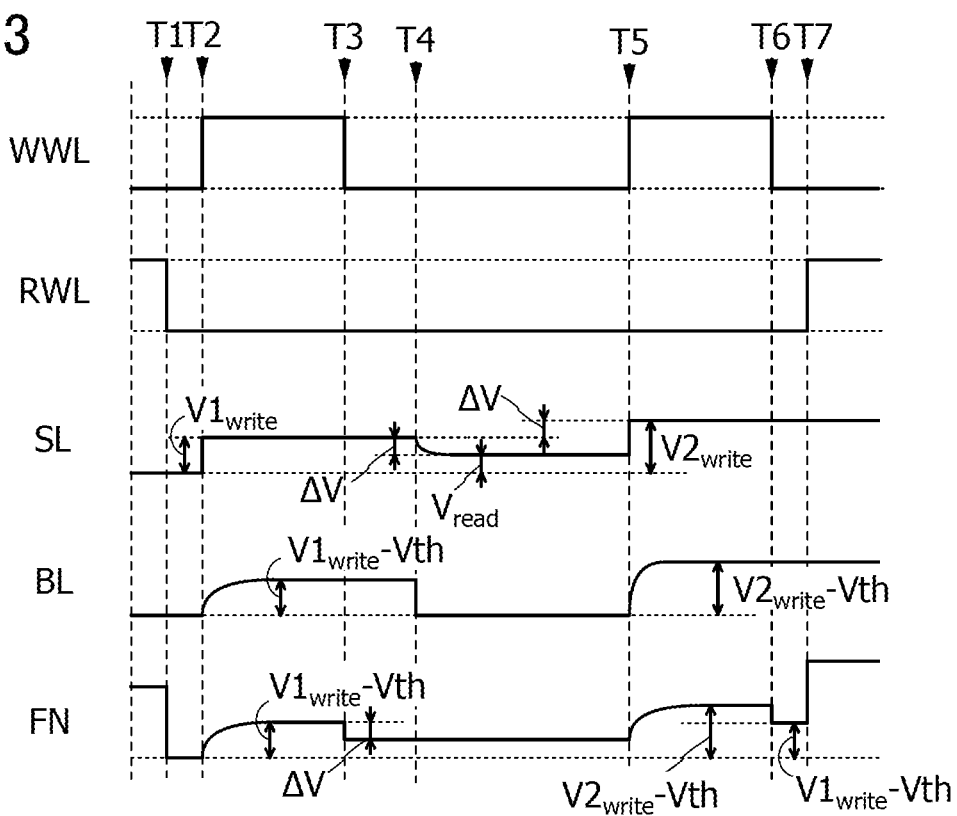

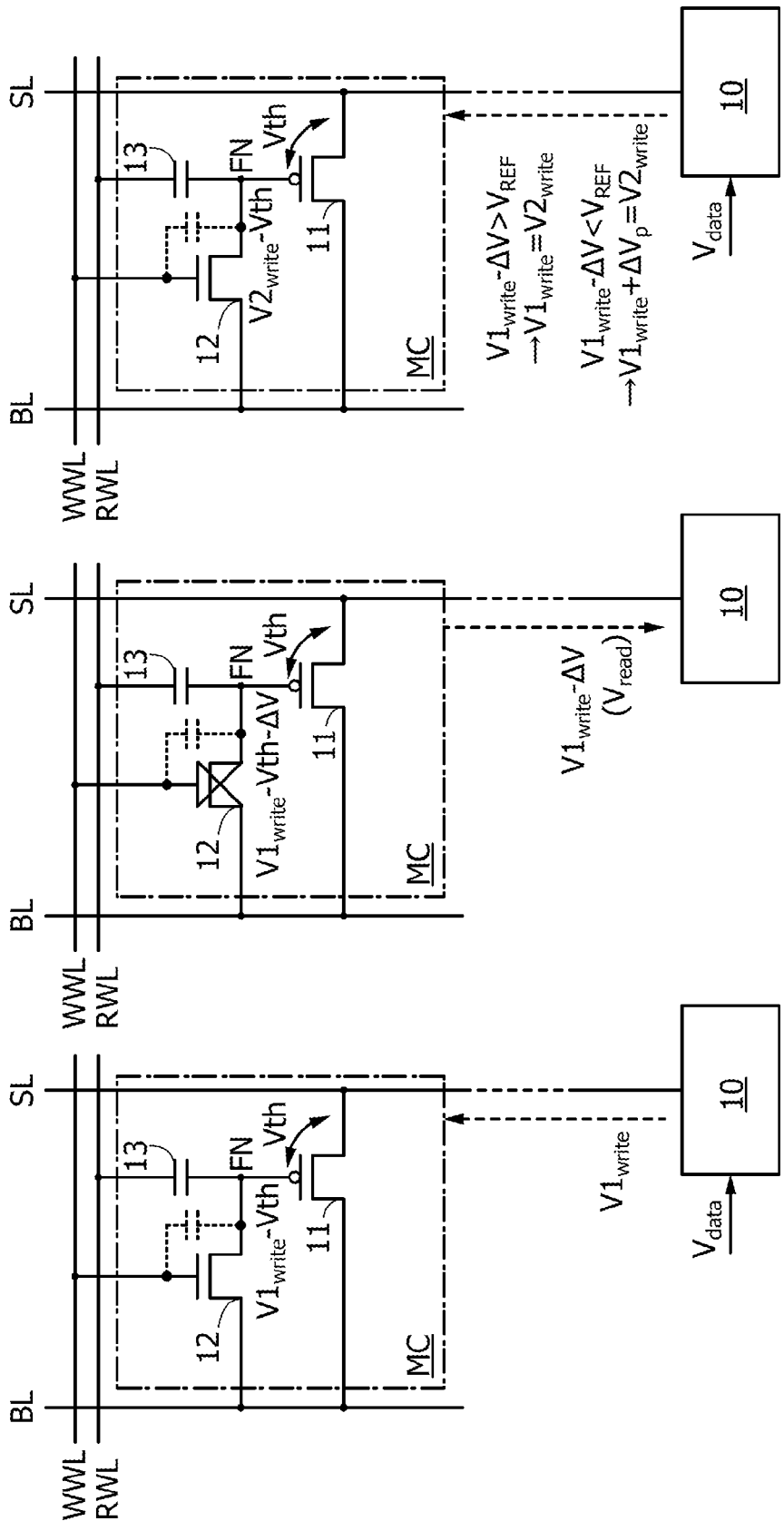

200

FIG. 16A
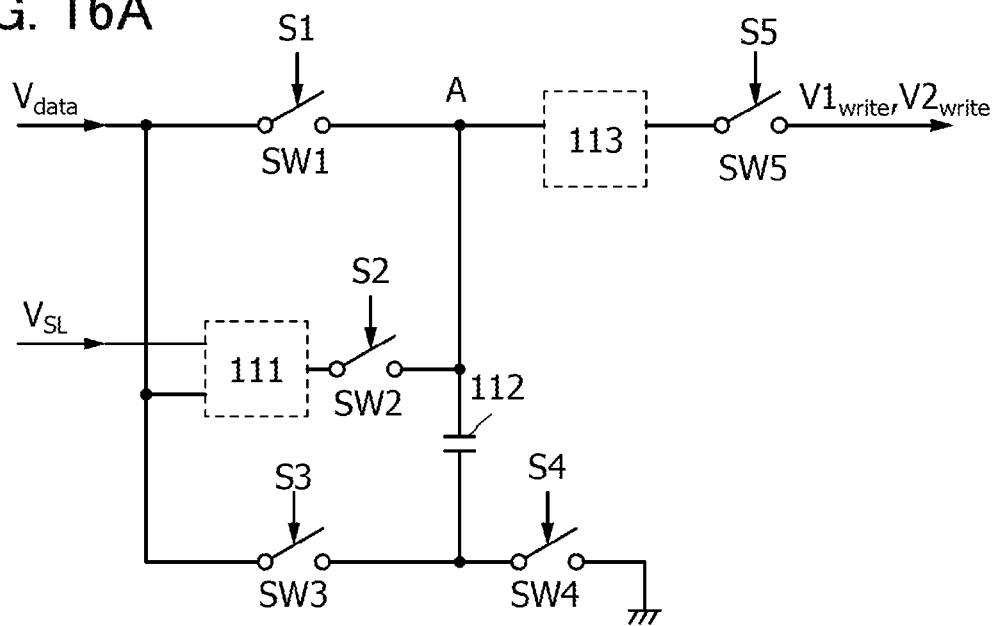
FIG. 16B1
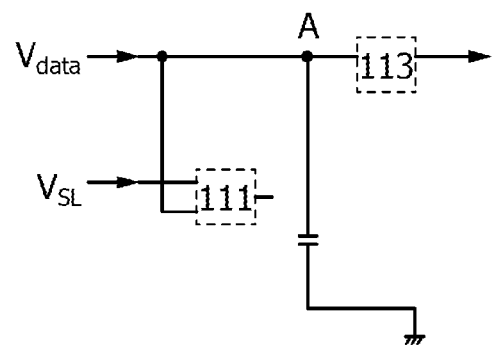
FIG. 16B2
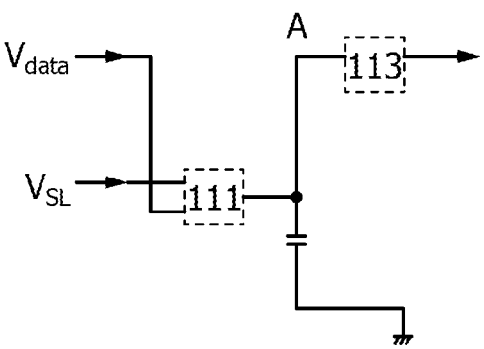
FIG. 16B3
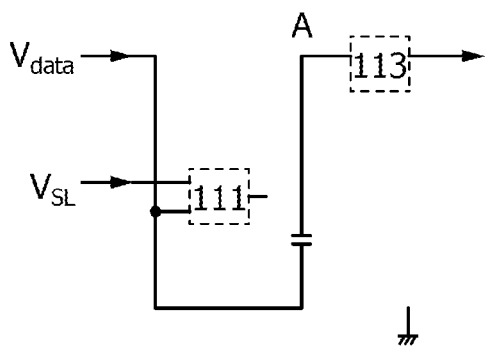

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics.

An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Much attention has been focused on a semiconductor device that retains multilevel data by using a combination of a transistor in which silicon (Si) is used for a semiconductor layer (hereinafter "Si transistor") and a transistor in which an oxide semiconductor (OS) is used for a semiconductor layer (hereinafter "OS transistor") (see Patent Document 1).

REFERENCE

Patent Document 1: Japanese Published Patent Application No. 2014-209402

SUMMARY OF THE INVENTION

In Patent Document 1, data is written through the OS transistor to a node that retains charge. There is a parasitic capacitance between the OS transistor and a wiring for controlling data writing. Because of the parasitic capacitance, the potential of the node retaining charge is changed by capacitive coupling when the OS transistor is turned off. Thus, there is a possibility that a retained voltage is affected by a change in potential of the node retaining charge and correct data cannot be read.

An object of one embodiment of the present invention is to provide a novel semiconductor device, a novel electronic device, or the like.

Another object of one embodiment of the present invention is to provide a semiconductor device or the like with a novel structure capable of reading a retained voltage as correct data even if the voltage is changed by switching of a transistor in a memory cell. Another object of one embodiment of the present invention is to provide a semiconductor device or the like with a novel structure capable of writing and reading multilevel data with an increased number of voltage levels to be retained.

Note that the objects of one embodiment of the present invention are not limited to the above. The objects described above do not preclude the existence of other objects. The other objects are objects that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a semiconductor device including a memory cell including a first transistor, and a write voltage generator circuit. The memory cell has a function of controlling writing or retention of data corresponding to one of a plurality of potentials by controlling an on/off state of the first transistor. The write voltage generator circuit has a function of outputting a first write voltage of data to be written to the memory cell. The write voltage generator circuit has a function of obtaining a read voltage of the data by reading the first write voltage written to the memory cell. The write voltage generator circuit has a function of generating a second write voltage by correcting the first write voltage that is changed when the first transistor is turned off, and outputting the second write voltage to the memory cell.

One embodiment of the present invention is a semiconductor device including a memory cell including a first transistor, and a write voltage generator circuit. The memory cell has a function of controlling writing or retention of data corresponding to one of a plurality of potentials by controlling an on/off state of the first transistor. The write voltage generator circuit has a function of outputting a first write voltage of data to be written to the memory cell. The write voltage generator circuit has a function of obtaining a read voltage of the data by reading the first write voltage written to the memory cell. The write voltage generator circuit has a function of generating a second write voltage by adding a potential of difference between the first write voltage and the read voltage to the first write voltage, and outputting the second write voltage to the memory cell.

One embodiment of the present invention is a semiconductor device including a memory cell including a first transistor, and a write voltage generator circuit. The memory cell has a function of controlling writing or retention of data corresponding to one of a plurality of potentials by controlling an on/off state of the first transistor. The write voltage generator circuit has a function of outputting a first write voltage of data to be written to the memory cell. The write voltage generator circuit has a function of obtaining a read voltage of the data by reading the first write voltage written to the memory cell. The write voltage generator circuit has a function of generating a second write voltage by adding, to the first write voltage, a voltage for correction corresponding to a result of comparison between the read voltage with a reference voltage, and outputting the second write voltage to the memory cell.

In the semiconductor device of one embodiment of the present invention, it is preferred that the memory cell include a second transistor, a gate of which is electrically connected to one of a source and a drain of the first transistor; that the first write voltage and the second write voltage be written through the first transistor and the second transistor to a node where the gate of the second transistor is electrically connected to the one of the source and the drain of the first transistor; and that the read voltage be read from the node through the first transistor and the second transistor.

In the semiconductor device of one embodiment of the present invention, the second transistor preferably contains silicon in a channel formation region.

In the semiconductor device of one embodiment of the present invention, the first transistor preferably contains an oxide semiconductor in a channel formation region.

In the semiconductor device of one embodiment of the present invention, it is preferred that the read voltage be read without precharging a wiring, the potential of which varies.

Note that other embodiments of the present invention will be described in Embodiments 1 to 6 with reference to the drawings.

One embodiment of the present invention can provide a novel semiconductor device, a novel electronic device, or the like.

One embodiment of the present invention can provide a semiconductor device or the like with a novel structure capable of reading a retained voltage as correct data even if the voltage is changed by switching of a transistor in a memory cell. One embodiment of the present invention can provide a semiconductor device or the like with a novel structure capable of writing and reading multilevel data with an increased number of voltage levels to be retained.

Note that the effects of one embodiment of the present invention are not limited to the above. The effects described above do not preclude the existence of other effects. The other effects are effects that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIGS. 1A to 1C are circuit diagrams illustrating one embodiment of the present invention;

FIGS. 2A to 2C are circuit diagrams illustrating one embodiment of the present invention;

FIG. 3 is a timing chart illustrating one embodiment of the present invention;

FIGS. 5A to 5C are circuit diagrams illustrating one embodiment of the present invention;

FIGS. 16A and 16B1 to 16B3 are circuit diagrams illustrating one embodiment of the present invention.

DETAILED DESCRIPTION OF THE INVENTION

Figure 4A:
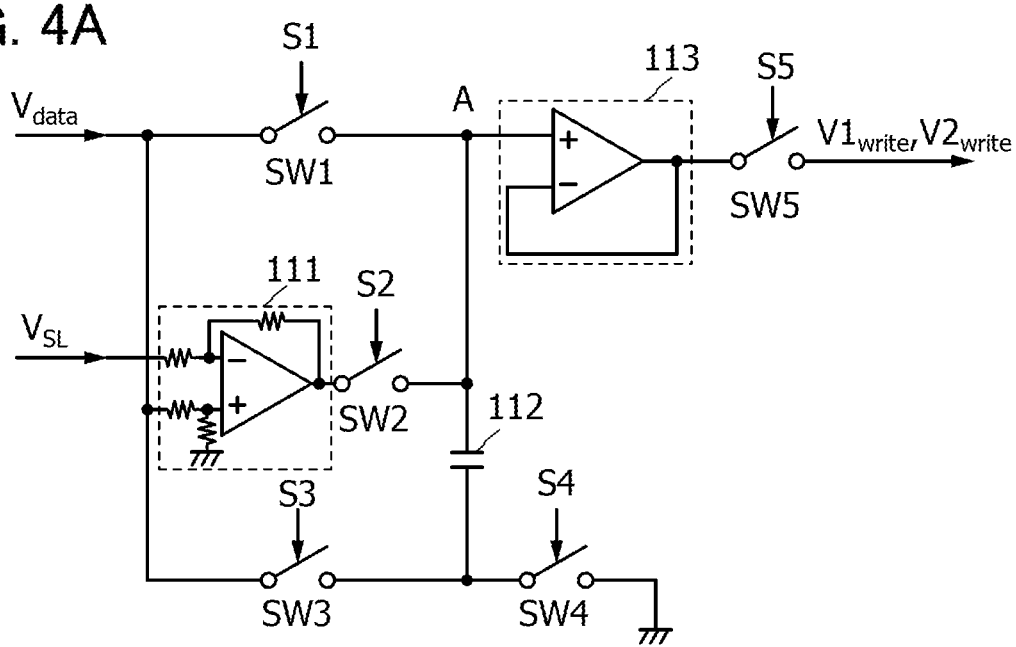
FIGS. 4A and 4B are a circuit diagram and a timing chart illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. For example, in this specification and the like, a "first" component in one embodiment can be referred to as a "second" component in other embodiments or claims. Furthermore, in this specification and the like, a "first" component in one embodiment can be referred to without the ordinal number in other embodiments or claims.

The same components, components having similar functions, components formed using the same material, components formed at the same time, or the like in the drawings are sometimes denoted by the same reference numerals, and the description thereof is not repeated in some cases.

Embodiment 1

This embodiment will show configurations of a memory cell and a write voltage generator circuit included in a semiconductor device of one embodiment of the disclosed invention.

The memory cell described in this embodiment is configured to retain multilevel data by controlling the on/off state of a transistor. In the memory cell, charge is retained at a node that is brought into an electrically floating state by turning off the transistor; thus, the potential of the node is changed by the parasitic capacitance of a gate of the transistor. This potential change might make it difficult to read correct data; accordingly, at the time of writing data, data retained in the memory cell is corrected by the write voltage generator circuit.

The write voltage generator circuit first writes, to the memory cell, a write voltage corresponding to data intended to be written. The written voltage is retained by turning off the transistor in the memory cell. The write voltage is retained in the above manner, which means that the retained voltage is changed from the written voltage. The voltage changed from the written voltage is read by the write voltage generator circuit as a read voltage.

The read voltage is obtained in such a manner that a wiring supplied with the write voltage is made electrically floating, and then a current is supplied to a transistor whose gate retains the written voltage and the wiring supplied with the write voltage is charged or discharged. The read voltage is obtained only by bringing the wiring supplied with the write voltage into an electrically floating state, i.e., obtained by simple switch switching without operation such as precharging of the wiring.

The read voltage, which is obtained by making the wiring supplied with the write voltage electrically floating, is used for correction of the write voltage in the write voltage generator circuit. For example, a potential of difference between the write voltage and the read voltage is obtained.

The potential of the difference corresponds to the amount of change of the write voltage during retention of the write voltage. In view of this, the potential corresponding to the potential change is added to the write voltage that has been written first, and the resulting voltage is written to the memory cell as a corrected write voltage.

As another example, the read voltage and a reference voltage are compared. The reference voltage is a voltage for determining whether a change in write voltage is allowed or not. When the comparison determines that the change in write voltage is allowed, the write voltage is written to the memory cell without correction, whereas when the comparison determines that the change is not allowed, a correction voltage is added to the write voltage and the corrected write voltage is written to the memory cell.

When the transistor in the memory cell is turned off, the write voltage written again is changed and becomes the write voltage for data that is initially intended to be written, because it includes the potential corresponding to the potential change. Thus, correct data can be read out, resulting in a semiconductor device with high data reliability.

Since retained data can be read as correct data, multilevel data with an increased number of voltage levels to be retained can be written and read. As a result, the data capacity per memory cell can be increased in the semiconductor device.

In this embodiment, an example of a memory cell and a write voltage generator circuit will be described below with reference to drawings. FIGS. 1A to 1C are circuit diagrams illustrating an example of a memory cell MC and a write voltage generator circuit 10 connected to the memory cell MC. A semiconductor device of one embodiment of the present invention is configured to perform operations in FIGS. 1A to 1C for data writing.

<Memory Cell MC>

First, a configuration example of the memory cell MC illustrated in FIGS. 1A to 1C will be described. The memory cell MC has a function of controlling writing or retention of data corresponding to one of a plurality of potentials by controlling the on/off state of a transistor.

The memory cell MC includes a transistor 11, a transistor 12, and a capacitor 13. Although not illustrated in FIGS. 1A to 1C, a plurality of memory cells MC are arranged in a matrix. The memory cell MC can control data writing and reading in response to signals supplied to a wiring BL, a wiring SL, a wiring WWL, and a wiring RWL.

A gate of the transistor 11 is connected to one of a source and a drain of the transistor 12. One of a source and a drain of the transistor 11 is connected to the wiring BL. The other of the source and the drain of the transistor 11 is connected to the wiring SL. Although FIGS. 1A to 1C show a p-channel transistor as the transistor 11, the transistor 11 may be an n-channel transistor.

The transistor 11 is preferably a transistor containing silicon in its channel formation region (Si transistor). Si transistors fabricated through the same process can have a small threshold voltage variation owing to impurity addition or the like.

A gate of the transistor 12 is connected to the wiring WWL. The other of the source and the drain of the transistor 12 is connected to the wiring BL. A node FN is a node between the transistor 11 and the transistor 12. Although FIGS. 1A to 1C show an n-channel transistor as the transistor 12, the transistor 12 may be a p-channel transistor.

The transistor 12 functions as a switch controlling data writing and retention. The transistor 12 is preferably a transistor in which a current flowing between the source and drain in the off state (off-state current) is low. A transistor with a low off-state current is preferably a transistor containing an oxide semiconductor in its channel formation region (OS transistor). An OS transistor has advantages such as a low off-state current and the capability of being formed to overlap a Si transistor. An OS transistor will be described in detail in Embodiment 3.

One electrode of the capacitor 13 is connected to the node FN. The other electrode of the capacitor 13 is connected to the wiring RWL.

The wiring WWL is supplied with a write word signal. The write word signal is a signal for turning on the transistor 12 so that the voltage of the wiring BL is supplied to the node FN.

One of the wiring BL and the wiring SL is supplied with a write voltage $V1_{write}$ for writing multilevel data to the memory cell MC, a read voltage $V_{read}$ for correcting a write voltage, a write voltage $V2_{write}$ after correction, a voltage obtained by selective reading of the write voltage $V2_{write}$ retained in the memory cell MC, and a precharge voltage $V_{precharge}$. One of the wiring BL and the wiring SL may be supplied with other voltages such as a voltage for initialization. Note that the wiring BL and the wiring SL can be made electrically floating after being supplied with a predetermined voltage.

Multilevel data is a signal having one of a plurality of voltage levels corresponding to data of two bits or more. The write voltage $V1_{write}$ is a voltage having one of a plurality of voltage levels. One of the wiring BL and the wiring SL is made electrically floating after being supplied with the write voltage $V1_{write}$.

The precharge voltage $V_{precharge}$ is supplied to one of the wiring BL and the wiring SL so that data is selectively read out. One of the wiring BL and the wiring SL is made electrically floating after being supplied with the precharge voltage $V_{precharge}$.

The wiring RWL is supplied with a read signal. The read signal is supplied to the other electrode of the capacitor 13 so that data is selectively read from the memory cell MC.

The other of the wiring BL and the wiring SL is supplied with a voltage for releasing the precharge voltage $V_{precharge}$, for example, a ground voltage $V_{GND}$ when the read voltage $V_{read}$ is read out. When the write voltage $V1_{write}$ and the write voltage $V2_{write}$ are written through the transistor 11, the other of the wiring BL and the wiring SL is preferably made into an electrically floating state.

<Functions of Write Voltage Generator Circuit>

Next, functions of the write voltage generator circuit 10 illustrated in FIGS. 1A to 1C will be described. The write voltage generator circuit 10 has a function of generating a voltage corresponding to data to be written to the memory cell MC.

FIGS. 1A to 1C schematically illustrate a plurality of functions separately for explaining operations of the write voltage generator circuit 10 for data writing. FIG. 1A illustrates an operation for writing the write voltage $V1_{write}$ to the memory cell MC on the basis of a data voltage $V_{data}$. FIG. 1B illustrates an operation for obtaining the read voltage $V_{read}$ by reading the write voltage $V1_{write}$ written to the memory cell MC. FIG. 1C illustrates an operation for writing the write voltage $V2_{write}$ to the memory cell MC on the basis of the write voltage $V_{write}$.

As illustrated in FIG. 1A, the write voltage generator circuit 10 has a function of generating the write voltage $V_{write}$ on the basis of the data voltage $V_{data}$ and supplying the write voltage $V1_{write}$ to the node FN through the wiring SL, the transistor 11, the wiring BL, and the transistor 12. As the write voltage $V1_{write}$, the data voltage $V_{data}$ without change or a voltage obtained by correcting the data voltage $V_{data}$ may be output, for example.

The write voltage $V1_{write}$ is retained at the node FN of the memory cell MC by turning off the transistor 12. The transistor 12 has a parasitic capacitance between a gate electrode and a source electrode or a drain electrode. Because of the parasitic capacitance, the potential of the node FN is decreased by capacitive coupling when a write word signal of the wiring WWL is changed from high to low. This potential decrease is denoted by $-\Delta V$. Accordingly, the write voltage $V1_{write}$ retained at the node FN becomes $V1_{write}-\Delta V$.

As illustrated in FIG. 1B, the write voltage generator circuit 10 has a function of reading $V1_{write}-\Delta V$, which is decreased by the parasitic capacitance. The voltage read out here can be referred to as the read voltage $V_{read}$. Although the read voltage $V_{read}$ is output as a value including Vth of the transistor 11, Vth is omitted here.

As illustrated in FIG. 1C, the write voltage generator circuit 10 has a function of generating the write voltage $V2_{write}$ by correcting a voltage corresponding to the change from the write voltage $V1_{write}$, which is previously written, to the read voltage $V_{read}$ and a function of supplying the write voltage $V2_{write}$ to the node FN through the wiring SL, the transistor 11, the wiring BL, and the transistor 12.

As the write voltage $V2_{write}$, a voltage obtained by adding a potential of difference between the write voltage $V1_{write}$ and the read voltage $V_{read}$ to the write voltage $V1_{write}$ is output, for example. Alternatively, a voltage obtained by adding a voltage for correction to the write voltage $V1_{write}$ is output as the write voltage $V2_{write}$; the voltage for correction is determined by comparison of the read voltage $V_{read}$ and a reference voltage.

>>Specific Example 1 of Write Voltage Generator Circuit>>

Next, specific operations of the write voltage generator circuit will be described.

Figure 4B:
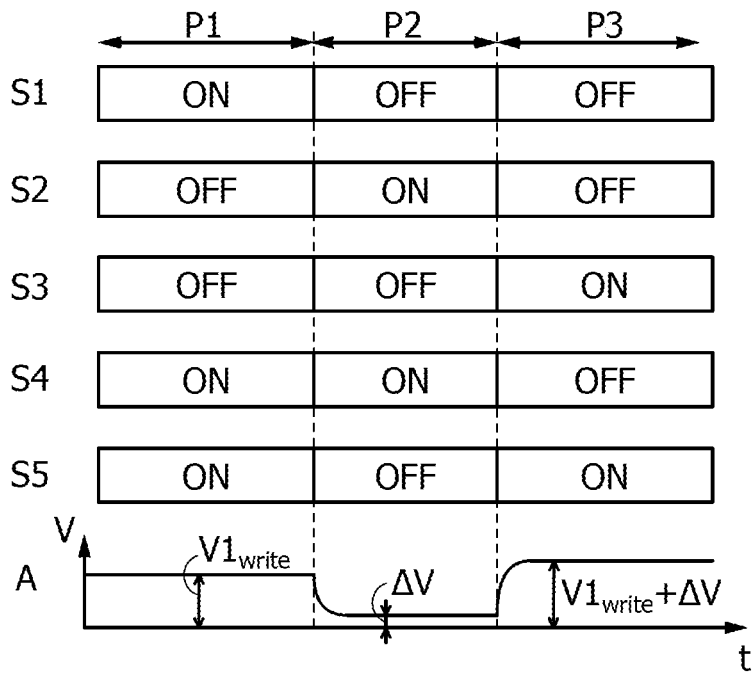

Like FIGS. 1A to 1C, FIGS. 2A to 2C schematically illustrate functions of the write voltage generator circuit 10 separately. FIG. 2A illustrates an operation for writing the write voltage $V1_{write}$. FIG. 2B illustrates an operation for obtaining the read voltage $V_{read}$. FIG. 2C illustrates an operation for writing the write voltage $V2_{write}$. FIG. 3 is a timing chart showing potential changes of the wirings in the operations of FIGS. 2A to 2C. FIG. 4A illustrates an example of the circuit for generating the write voltage $V1_{write}$, the read voltage $V_{read}$, and the write voltage $V2_{write}$ in the operations of FIGS. 2A to 2C. FIG. 4B is a timing chart for explaining the operation of the circuit.

As illustrated in FIG. 2A, the write voltage generator circuit 10 has a function of generating the write voltage $V1_{write}$ on the basis of the data voltage $V_{data}$ and supplying the write voltage $V1_{write}$ to the node FN through the wiring SL, the transistor 11, the wiring BL, and the transistor 12. As the write voltage $V1_{write}$, the data voltage $V_{data}$ without change or a voltage obtained by correcting the data voltage $V_{data}$ may be output, for example.

The write voltage $V1_{write}$ is supplied to the wiring SL, the wiring BL is brought into an electrically floating state, and the transistors 11 and 12 are turned on. Thus, the write voltage $V1_{write}$ supplied to the wiring SL is decreased by the threshold voltage Vth of the transistor 11, and the decreased voltage is supplied to the node FN. That is, $V1_{write}-Vth$ is supplied to the node FN.

By turning off the transistor 12, $V1_{write}-Vth$ supplied to the node FN is retained at the node FN of the memory cell MC. The transistor 12 has a parasitic capacitance between the gate electrode and the source or drain electrode. Because of the parasitic capacitance, the potential of the node FN is decreased by capacitive coupling when a write word signal of the wiring WWL is changed from high to low. This potential decrease is denoted by $-\Delta V$. Accordingly, $V1_{write}-Vth$ retained at the node FN becomes $V1_{write}-Vth-\Delta V$.

As illustrated in FIG. 2B, the write voltage generator circuit 10 reads $V1_{write}-Vth-\Delta V$, which is decreased by the parasitic capacitance. At this time, the wiring SL is brought into an electrically floating state while being supplied with the write voltage $V1_{write}$, and the wiring BL is set to the ground potential. Thus, a voltage (Vgs) corresponding to the decrease of the potential of the node FN from the write voltage $V1_{write}$ is generated between the gate and the source of the transistor 11, and a current flows through the transistor 11. When a current flows through the transistor 11, the potential of the wiring SL decreases from the write voltage $V1_{write}$, and a flowing current decreases when Vgs of the transistor 11 becomes Vth. The potential of the wiring SL at this time is $V1_{write}-\Delta V$, that is, the read voltage $V_{read}$.

As illustrated in FIG. 2C, the write voltage generator circuit 10 supplies a voltage obtained by adding a potential of difference between the write voltage $V1_{write}$ and the read voltage $V_{read}$ to the write voltage $V1_{write}$, to the wiring SL as the write voltage $V2_{write}$.

The write voltage $V2_{write}$ is written in such manner that the wiring BL is made electrically floating again and the transistors 11 and 12 are turned on. Thus, the write voltage $V2_{write}$ supplied to the wiring SL is decreased by the threshold voltage Vth of the transistor 11, and the decreased voltage is supplied to the node FN. That is, $V2_{write}-Vth$ is supplied to the node FN.

When the transistor in the memory cell is turned off, the written $V2_{write}-Vth$ is changed and becomes $V1_{write}-Vth$, which includes the write voltage for data that is initially intended to be written. This is because $V2_{write}-Vth$ includes the potential corresponding to the potential change. Thus, correct data can be read out, resulting in a semiconductor device with high data reliability.

The change of the potential of the node FN to $V1_{write}-Vth$ in the operations for writing data will be described with reference to the timing chart in FIG. 3.

At a time T1, a read signal of the wiring RWL is set low. The node FN is electrically floating and its potential decreases in response to the change in potential of the wiring RWL, whereby the transistor 11 is turned on. The wiring BL is made electrically floating by being supplied with a potential for initialization.

At a time T2, a write word signal of the wiring WWL is set high. The transistor 12 is turned on. Moreover, at the time T2, the write voltage $V1_{write}$ is supplied to the wiring SL. Consequently, a current flows through the transistor 11, and the potentials of the wiring BL and the node FN increase and finally become $V1_{write}-Vth$.

At a time T3, a write word signal of the wiring WWL is set low. Thus, the potential of the node FN is decreased by $-\Delta V$ because of capacitive coupling due to the parasitic capacitance of the transistor 12.

At a time T4, the wiring SL supplied with the write voltage $V1_{write}$ is made electrically floating, and the wiring BL is set to the ground potential. Since the potential of the node FN has decreased, a current flows through the transistor 11, and the potential of the wiring SL decreases and becomes $V1_{write}-\Delta V$, that is, the read voltage $V_{read}$.

At a time T5, a write word signal of the wiring WWL is set high. The transistor 12 is turned on. Moreover, at the time T5, the write voltage $V2_{write}$ is supplied to the wiring SL.

The write voltage $V2_{write}$ is $V1_{write}+\Delta V$, which is higher than the write voltage $V1_{write}$ by $\Delta V$. Consequently, a current flows through the transistor 11, and the potentials of the wiring BL and the node FN increase and finally become $V2_{write}$–Vth, that is, $V1_{write}+\times V$–Vth.

At a time T6, a write word signal of the wiring WWL is set low. Thus, the potential of the node FN is decreased by $-\Delta V$ because of capacitive coupling due to the parasitic capacitance of the transistor 12. As a result, the potential of the node FN becomes $V1_{write}$–Vth.

At a time T7, a read signal of the wiring RWL is set high. The node FN is electrically floating and its potential decreases in response to the change in potential of the wiring RWL, whereby the transistor 11 is turned off.

Through the above operations, the node FN can be set to $V1_{write}$–Vth.

Operations of the write voltage generator circuit 10 for outputting the write voltage $V1_{write}$ and the write voltage $V2_{write}$ will be described with reference to the circuit diagram of FIG. 4A and the timing chart of FIG. 4B.

In the circuit diagram of FIG. 4A, the write voltage generator circuit 10 includes switches SW1 to SW5, an operational amplifier 111, a capacitor 112, and an operational amplifier 113. The operational amplifier 111 is supplied with the data voltage $V_{data}$ and a voltage $V_{SL}$ of the wiring SL. The operational amplifier 111 is a differential amplifier circuit with a gain of 1. The operational amplifier 113 is a buffer circuit. A node from which an input potential of the operational amplifier 113 is supplied is denoted by a node A. An output potential of the operational amplifier 113 is output as the write voltage $V1_{write}$ and the write voltage $V2_{write}$. The on/off states of the switches SW1 to SW5 are controlled by respective control signals S1 to S5. The operational amplifiers 111 and 113 can be represented by blocks as shown in FIG. 16A.

The timing chart of FIG. 4B shows three periods P1 to P3 for switching the switches. In the period P1, the write voltage $V1_{write}$ is supplied to the wiring SL. In the period P2, the wiring SL is made electrically floating and the read voltage $V_{read}$ is obtained. In the period P3, the write voltage $V2_{write}$ is supplied to the wiring SL.

In the period P1, the switches SW1, SW4, and SW5 are turned on and the switches SW2 and SW3 are turned off. The data voltage $V_{data}$ without change is supplied to the node A. The data voltage $V_{data}$ can be the write voltage $V1_{write}$. At this time, the potential of an electrode of the capacitor 112 that is opposite to an electrode on the node A side is set at the ground potential.

In the period P2, the switch SW2 is turned on, the switch SW4 remains on, the switches SW1 and SW5 are turned off, and the switch SW3 remains off. The wiring SL is made electrically floating while being supplied with the write voltage $V1_{write}$, and the node A is supplied with the data voltage $V_{data}$ and the read voltage $V_{read}$, which is the voltage of the wiring SL. By differential amplification in the operational amplifier 111, the voltage of the node A becomes a voltage $\Delta V$ that is a difference between the write voltage $V1_{write}$ and the read voltage $V_{read}$.

In the period P3, the switches SW3 and SW5 are turned on, the switches SW2 and SW4 are turned off, and the switch SW1 remains off. The node A becomes electrically floating, and the potential of the electrode of the capacitor 112 on the side opposite to the node A becomes the data voltage $V_{data}$. Thus, the voltage $\Delta V$ at the node A becomes $V_{data}+\Delta V$, that is, $V1_{write}+\Delta V$ because of capacitive coupling of the capacitor 112. Moreover, $V1_{write}+\Delta V$ can be the write voltage $V2_{write}$.

Through the above operations, the write voltage $V1_{write}$ and the write voltage $V2_{write}$ can be output to the wiring SL. Note that the operations during the periods P1 to P3 only require the wirings to be connected as illustrated in FIGS. 16B1 to 16B3; thus, the arrangement of the switches is not limited to that shown in FIG. 4A.

>>Specific Example 2 of Write Voltage Generator Circuit<<

Next, an example of the operations of the write voltage generator circuit that are different from those in FIGS. 1A to 1C and FIGS. 2A to 2C will be described.

Figure 6:
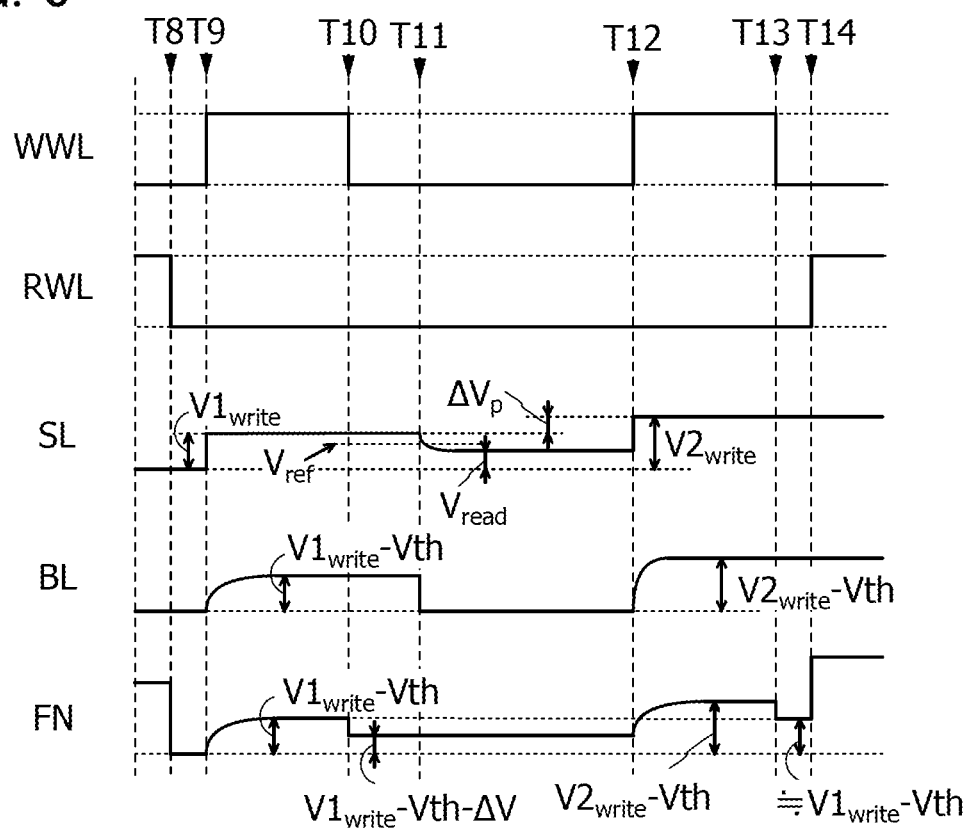
FIG. 6 is a timing chart illustrating one embodiment of the present invention.
Figure 7:
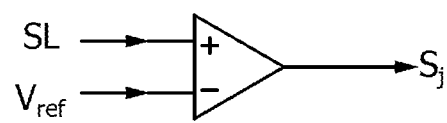
FIG. 7 is a circuit diagram illustrating one embodiment of the present invention.

Like FIGS. 1A to 1C, FIGS. 5A to 5C schematically illustrate functions of the write voltage generator circuit 10 separately. FIG. 5A illustrates an operation for writing the write voltage $V1_{write}$. FIG. 5B illustrates an operation for obtaining the read voltage $V_{read}$. FIG. 5C illustrates an operation for writing the write voltage $V2_{write}$. FIG. 6 is a timing chart showing potential changes of the wirings in the operations of FIGS. 5A to 5C. FIG. 7 illustrates an example of a circuit for comparing the read voltage $V_{read}$ with a reference voltage $V_{REF}$.

The description of FIGS. 5A and 5B is the same as that of FIGS. 2A and 2B. That is, the write voltage $V1_{write}$ is first written to the node FN, and the read voltage $V_{read}$ is obtained so that data on a change in potential caused by turning off the transistor 12 is obtained.

As illustrated in FIG. 5C, the write voltage generator circuit 10 compares the levels of the reference voltage $V_{REF}$ and the read voltage $V_{read}$ and determines a voltage applied as the write voltage $V2_{write}$. For example, when the read voltage $V_{read}$ is higher than the reference voltage $V_{REF}$, $\Delta V$ is determined to be low and a voltage equivalent to the write voltage $V1_{write}$ is output to the wiring SL as the write voltage $V2_{write}$. When the read voltage $V_{read}$ is lower than the reference voltage $V_{REF}$, $\Delta V$ is determined to be high and a voltage obtained by adding $\Delta V_p$ to the write voltage $V1_{write}$ is output to the wiring SL as the write voltage $V2_{write}$.

Note that a reference voltage is a voltage for determining the allowable range of the difference between a write voltage and a read voltage, and for example, may be an intermediate voltage between one write voltage and a write voltage that is one level lower than the one write voltage.

The write voltage $V2_{write}$ is written in such manner that the wiring BL is made electrically floating again and the transistors 11 and 12 are turned on. Thus, the write voltage $V2_{write}$ supplied to the wiring SL is decreased by the threshold voltage Vth of the transistor 11, and the decreased voltage is supplied to the node FN. That is, $V2_{write}$–Vth is supplied to the node FN.

When the transistor in the memory cell is turned off, the written $V2_{write}$–Vth is changed and becomes a voltage that is not much different from $V1_{write}$–Vth, which is initially intended to be written. This is because $V2_{write}$–Vth includes the potential corresponding to the potential change. Thus, the read data can be more correct data, resulting in a semiconductor device with high data reliability.

Changing the potential of the node FN to make it close to $V1_{write}$–Vth by the operations for data writing will be described with reference to the timing chart in FIG. 6.

Operations at a time T8 to a time T11 are the same as those at the time T1 to the time T4. That is, the write voltage $V1_{write}$ is supplied to the node FN and retained as $V1_{write}$–Vth–$\Delta V$. Then, the read voltage $V_{read}$ is obtained.

At a time T12, a write word signal of the wiring WWL is set high. The transistor 12 is turned on. Moreover, at the time T12, the write voltage $V2_{write}$ is supplied to the wiring SL.

The levels of the reference voltage $V_{REF}$ and the read voltage $V_{read}$ are compared to determine a voltage applied as the write voltage $V2_{write}$ at the time T12. When the read voltage $V_{read}$ is higher than the reference voltage $V_{REF}$, $\Delta V$ is determined to be low and a voltage equivalent to the write voltage $V1_{write}$ is output to the wiring SL as the write voltage $V2_{write}$. When the read voltage $V_{read}$ is lower than the reference voltage $V_{REF}$ as in FIG. 6, $\Delta V$ is determined to be high and a voltage obtained by adding $\Delta V_p$ to the write voltage $V1_{write}$ is output to the wiring SL as the write voltage $V2_{write}$.

At a time T13, a write word signal of the wiring WWL is set low. Thus, the potential of the node FN is decreased by $-\Delta V$ because of capacitive coupling due to the parasitic capacitance of the transistor 14. Since $\Delta V_p$ is added because of the write voltage $V2_{write}$ at the time T12, the potential of the node FN can be close to $V1_{write}$–Vth, compared to the case where $\Delta V_p$ is not added.

At a time T14, a read signal of the wiring RWL is set high. The node FN is electrically floating and its potential increases in response to the change in potential of the wiring RWL, whereby the transistor 11 is turned off.

Through the above operations, the potential of the node FN can be made close to $V1_{write}$–Vth.

FIG. 7 illustrates a circuit for comparing the reference voltage $V_{REF}$ and the potential of the wiring SL. As illustrated in FIG. 7, a comparator is used to obtain a signal $S_j$. The signal $S_j$ switches between high and low levels when one of the reference voltage $V_{REF}$ and the voltage of the wiring SL is high, and a voltage applied as the write voltage $V2_{write}$ can be determined using the difference in level of the signal $S_j$. The voltage addition accompanied by the determination may be performed with the circuit described using FIGS. 4A and 4B; alternatively, a write voltage to which the voltage $\Delta V_p$ corresponding to the potential change may be prepared.

Through the above operations, the write voltage $V1_{write}$ and the write voltage $V2_{write}$ can be output to the wiring SL.
<Block Diagram of Semiconductor Device>

Figure 8:
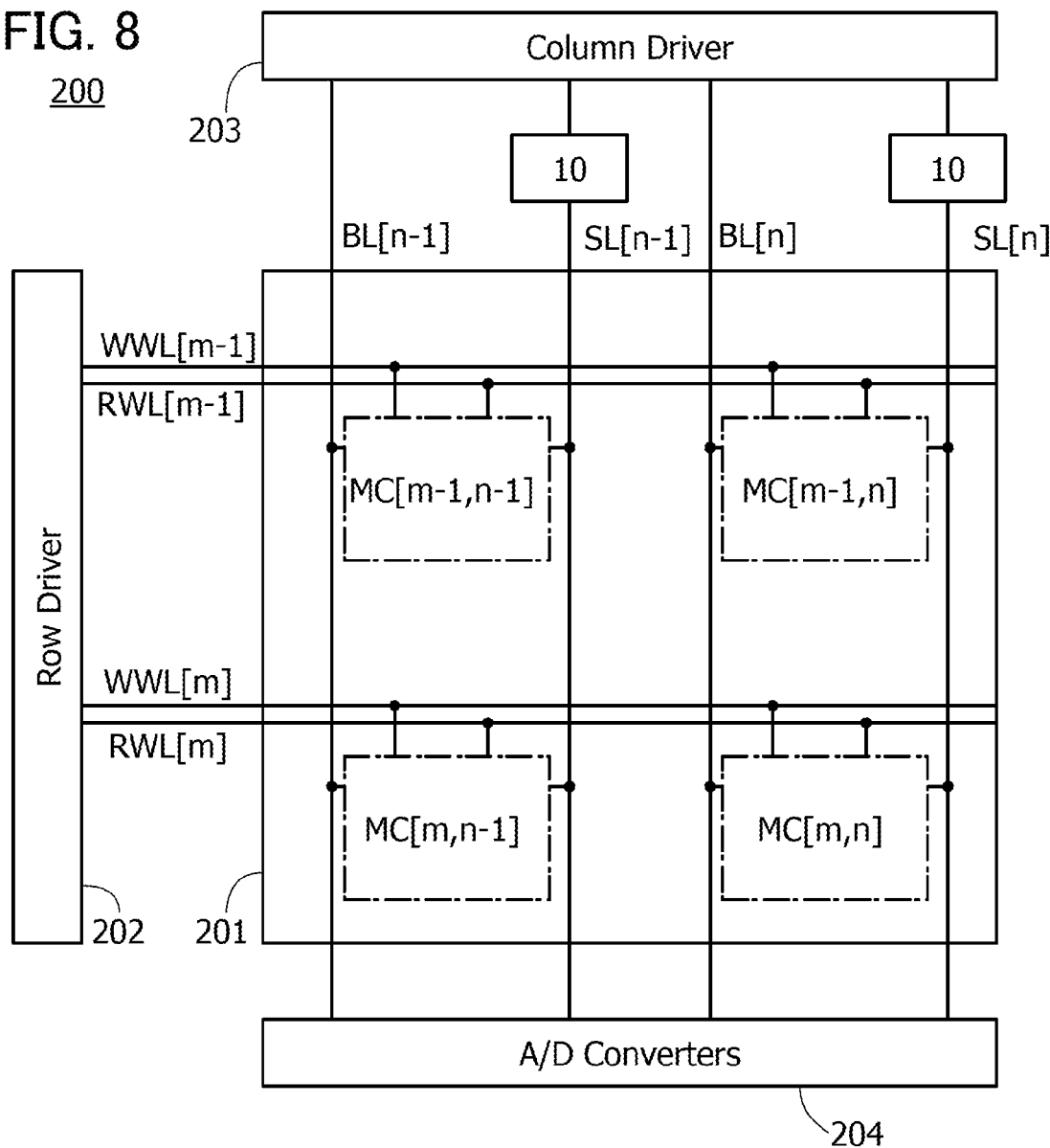
FIG. 8 is a block diagram illustrating one embodiment of the present invention.

FIG. 8 is a block diagram illustrating a configuration example of a semiconductor device including the memory cell MC and the write voltage generator circuit 10 shown in FIGS. 1A to 1C.

A semiconductor device 200 illustrated in FIG. 8 includes a memory cell array 201 including a plurality of memory cells MC described using FIGS. 1A to 1C, the write voltage generator circuits 10, a row driver 202, a column driver 203, and A/D converters 204. The semiconductor device 200 includes the memory cells MC arranged in a matrix with m rows and n columns. FIG. 8 also shows a wiring WWL[m−1] and a wiring RWL[m−1] in the (m−1)th row, a wiring WWL[m] and a wiring RWL[m] in the m-th row, a wiring BL[n−1] and a wiring SL[n−1] in the (n−1)th column, and a wiring BL[n] and a wiring SL[n] in the n-th column.

In the memory cell array 201 in FIG. 8, the memory cells MC illustrated in FIGS. 1A to 1C are arranged in a matrix. Note that the components of the memory cell MC are the same as those in FIGS. 1A to 1C; thus, the description of the components is omitted here and the description of FIGS. 1A to 1C can be referred to.

In the memory cell array 201 in FIG. 8, the write voltage generator circuit 10 is provided between the column driver 203 for outputting data voltages and each of the wirings SL[n−1] and SL[n]. With this configuration, in data writing, the write voltage generator circuit 10 can be used for one memory cell MC to which data is to be written. Note that in a configuration where data voltages to be supplied to the wirings SL are distributed by a selector switch or the like, the selector switch is provided for every write voltage generator circuit 10.

The row driver 202 has functions of selectively turning on the transistor 12 in the memory cells MC of each row and selectively changing the potential of the node FN in the memory cells MC of each row. Specifically, the row driver 202 supplies a write word signal to the wiring WWL and supplies a read signal to the wiring RWL. The row driver 202 enables the semiconductor device 200 to select the memory cells MC to/from which data is written/read row by row.

The column driver 203 has functions of supplying data to the write voltage generator circuit 10, precharging the wiring SL, bringing the wiring SL into an electrically floating state, setting the wiring BL to the ground potential, and bringing the wiring BL into an electrically floating state. Specifically, the column driver 203 supplies a potential corresponding to multilevel data to the write voltage generator circuit 10, supplies the precharge voltage $V_{precharge}$ to the wiring SL, and supplies the ground potential to the wiring BL. The column driver 203 enables the semiconductor device 200 to select the memory cells MC to/from which data is written/read column by column.

The write voltage generator circuit 10 in FIG. 8 is the write voltage generator circuit 10 described above. The configuration of the write voltage generator circuit 10 is the same as above; thus, the description thereof is omitted here and the above description can be referred to.

The A/D converter 204 has a function of converting the potential of the wiring SL, which is an analog value, into a digital value and outputting the digital value to the outside. The A/D converter 204 can be a flash A/D converter, a successive approximation A/D converter, a multi-slope A/D converter, or a delta-sigma A/D converter.

SUMMARY

As described above, in the semiconductor device including the memory cell MC and the write voltage generator circuit 10 each having the configuration in this embodiment, a retained voltage can be read as correct data even if it is changed when the transistor in the memory cell MC is turned on or off. Thus, in the semiconductor device, data read from the memory cell MC is highly reliable.

In the semiconductor device described above, multilevel data with an increased number of voltage levels to be retained can be written and read because retained data can be read as correct data. As a result, the data capacity per memory cell MC can be increased in the semiconductor device.

Embodiment 2

This embodiment will show variation examples of the configuration of the memory cell MC described in Embodiment 1 and a variation example of a read voltage read by the write voltage generator circuit 10 described in Embodiment 1.
<Variation Examples of Memory Cell MC>

FIGS. 9A to 9E illustrate examples of a circuit configuration that the memory cell MC in FIGS. 1A to 1C can have.

Figure 9A:
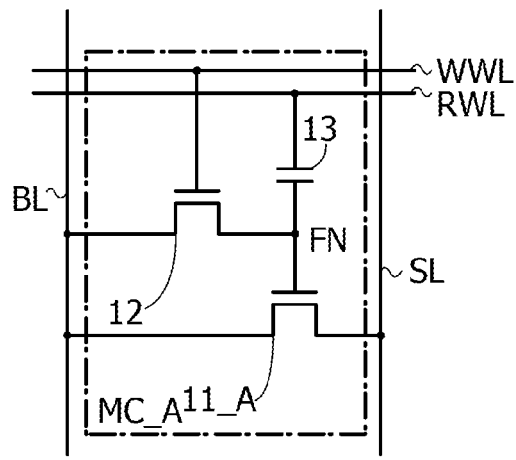
FIGS. 9A to 9E are circuit diagrams each illustrating one embodiment of the present invention.

A memory cell MC_A illustrated in FIG. 9A includes a transistor 11_A, the transistor 12, and the capacitor 13. The transistor 11_A is an n-channel transistor. The memory cell MC in FIGS. 1A to 1C can employ the configuration in FIG. 9A.

Figure 9B:
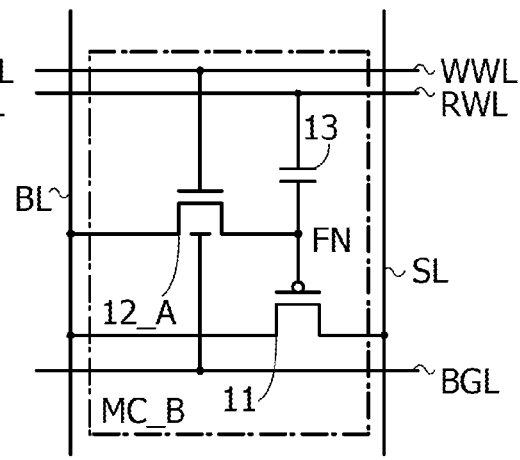

A memory cell MC_B illustrated in FIG. 9B includes the transistor 11, a transistor 12_A, and the capacitor 13. The transistor 12_A includes a backgate that can be controlled by a wiring BGL. This configuration enables control of the threshold voltage of the transistor 12_A. The memory cell MC in FIGS. 1A to 1C can employ the configuration in FIG. 9B.

Figure 9C:
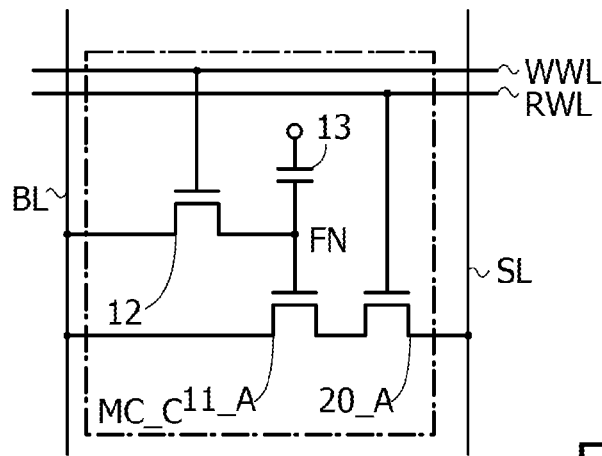

A memory cell MC_C illustrated in FIG. 9C includes the transistor 11_A, the transistor 12, the capacitor 13, and a transistor 20_A. The transistor 20_A is an n-channel transistor like the transistor 11_A. The memory cell MC in FIGS. 1A to 1C can employ the configuration in FIG. 9C.

Figure 9D:
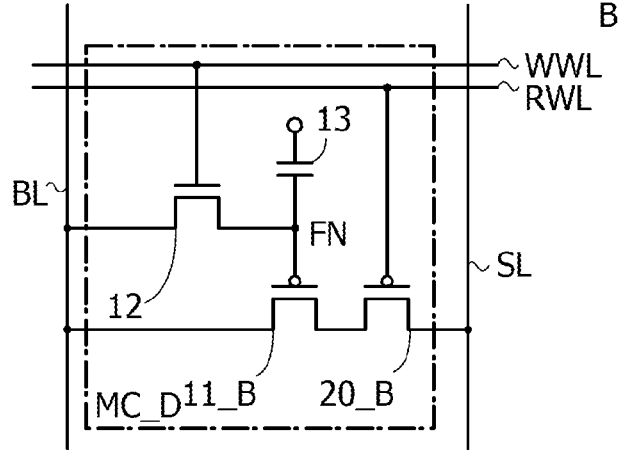

A memory cell MC_D illustrated in FIG. 9D includes a transistor 11_B, the transistor 12, the capacitor 13, and a transistor 20_B. The transistor 11_B and the transistor 20_B are p-channel transistors. The memory cell MC in FIGS. 1A to 1C can employ the configuration in FIG. 9D.

Figure 9E:
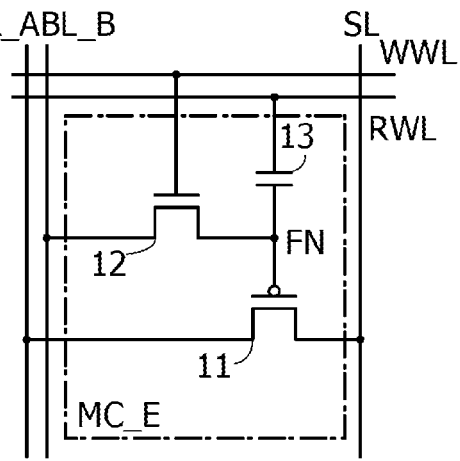

A memory cell MC_E illustrated in FIG. 9E includes the transistor 11, the transistor 12, and the capacitor 13. The transistor 11 is connected to a bit line BL_A. The transistor 12 is connected to a bit line BL_B. In the configuration of FIG. 9E, the bit line BL_A can be used for data reading, and the bit line BL_B can be used for data writing, for example. The memory cell MC in FIGS. 1A to 1C can employ the configuration in FIG. 9E.

<Read Voltage Read by Write Voltage Generator Circuit 10>

Figure 10A:
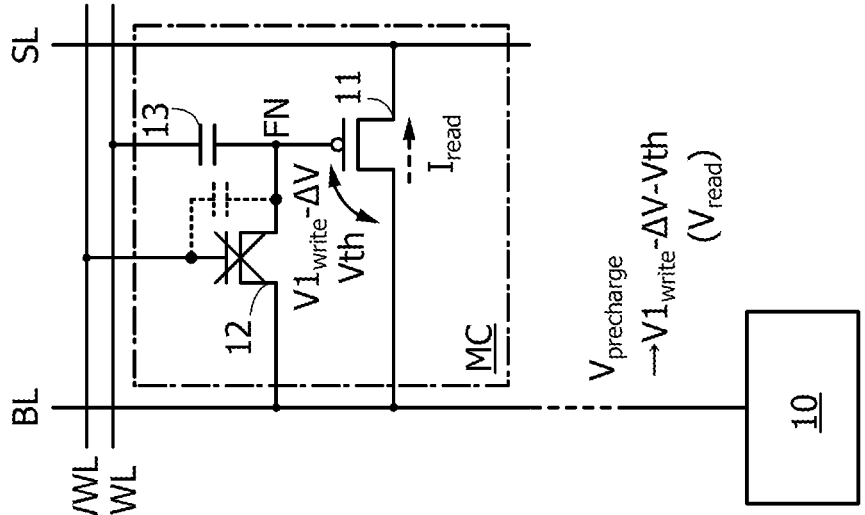
FIGS. 10A and 10B are circuit diagrams illustrating one embodiment of the present invention.
Figure 10B:
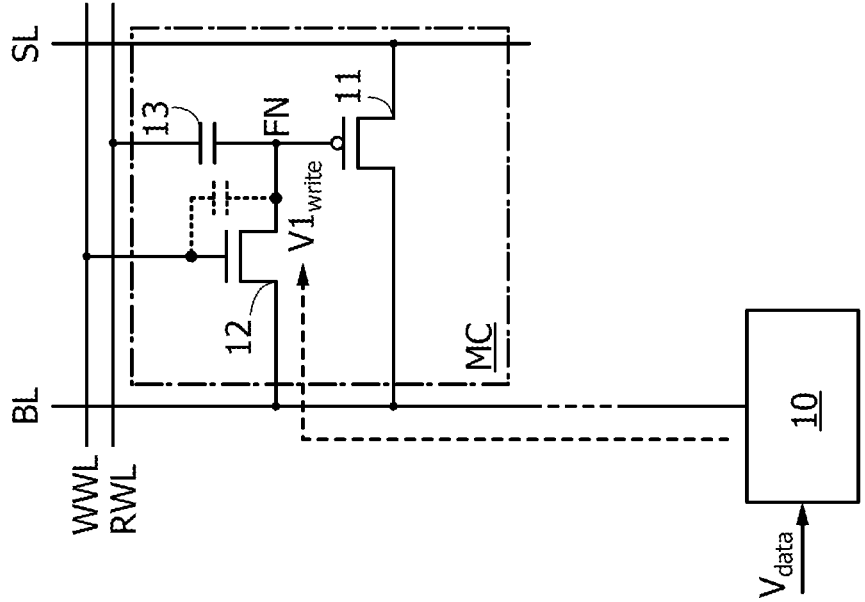

Although the write voltage generator circuit 10 is connected to the wiring SL in the example of FIGS. 1A to 1C, it may employ another configuration, and for example, may be connected to the wiring BL. FIGS. 10A and 10B illustrate the write voltage generator circuit 10 connected to the wiring BL.

In the circuit diagram of FIG. 10A, the write voltage $V1_{write}$ is applied to the wiring BL without passing through the transistor 11. The write voltage $V1_{write}$ applied to the wiring BL is written to the node FN by turning on the transistor 12. With this configuration, in writing the write voltage $V1_{write}$, data can be written independently of the amount of current flowing through the transistor 11. Thus, data can be written at high speed.

In the circuit diagram of FIG. 10B, the write voltage $V1_{write}$ applied to the node FN can be retained in the memory cell MC by turning off the transistor 12. By turning off the transistor 12, the write voltage $V1_{write}$ retained at the node FN is decreased by $\Delta V$ because of the parasitic capacitance of the transistor 12. Then, $V1_{write}-\Delta V$, which results from this voltage decrease and is retained at the node FN, is read out to obtain a read voltage, and the write voltage $V2_{write}$ is generated.

In the circuit diagram of FIG. 10B, the read voltage is preferably obtained by supplying the precharge voltage $V_{precharge}$ to the wiring BL. This configuration enables the read voltage to be obtained even when the potential difference between the wiring BL and the node FN is smaller than the threshold voltage Vth of the transistor 11 and a current $I_{read}$ cannot flow through the transistor 11. When the current $I_{read}$ flows, $V1_{write}-\Delta V-Vth$, the voltage decreased from $V1_{write}-\Delta V$ (the potential of the node FN) by the threshold voltage Vth of the transistor 11, can be obtained as the read voltage $V_{read}$ through the wiring BL.

As has been described, one embodiment of the present invention can operate using any of a variety of variation examples.

Embodiment 3

In this embodiment, the OS transistor shown in the above embodiment will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8\times10^{11}/cm^3$, preferably lower than $1\times10^{11}/cm^3$, further preferably lower than $1\times10^{10}/cm^3$, and is higher than or equal to $1\times10^{-9}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves an ultralow off-state current.

Note that the OS transistor with a reduced off-state current can exhibit a normalized off-state current per micrometer in channel width of $1\times10^{-18}$ A or less, preferably $1\times10^{-21}$ A or less, further preferably $1\times10^{-24}$ A or less at room temperature (approximately 25° C.), or $1\times10^{-15}$ A or less, preferably $1\times10^{-18}$ A or less, further preferably $1\times10^{-21}$ A or less at 85° C.

For example, the case where data voltages for 4-bit data are retained at the node FN is considered. Given that the power supply voltage ranges from 2 V to 3.5 V, the storage capacitance is 0.1 fF, the distribution width of a retained potential is less than 30 mV, and the allowable variation of a retained potential is less than 80 mV, a leakage current from the node FN needs to be less than $0.025\times10^{-24}$ A to keep a retained potential within the allowable variation range at 85° C. for ten years. When a leakage from other portions is extremely small and the OS transistor contributes to almost all the leakage, given that the OS transistor has a channel width of 60 nm, the leakage current of the OS transistor per unit area is preferably less than $0.423\times10^{-24}$ A/μm. By satisfying these specifications, the memory cell MC can retain data at 85° C. for ten years.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to an off-state current at given Vgs, at Vgs in a given range, or at Vgs at which a sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

An oxide semiconductor used for a semiconductor layer of an OS transistor preferably contains at least indium (In) or zinc (Zn). In particular, the oxide semiconductor preferably contains In and Zn. A stabilizer for strongly bonding with oxygen is preferably contained in addition to In and Zn. As a stabilizer, at least one of gallium (Ga), tin (Sn), zirconium (Zr), hafnium (Hf), and aluminum (Al) is contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, 4:2:3, or 2:1:3 or close thereto.

<Impurities in Oxide Semiconductor>

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is conceivably reduced by the dehydration treatment (dehydrogenation treatment). For this reason, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be transformed to an i-type (intrinsic) oxide semiconductor film or a substantially i-type (intrinsic) oxide semiconductor film that is extremely close to an i-type oxide semiconductor film. The term "substantially intrinsic" means that the oxide semiconductor film contains extremely few (close to zero) carriers derived from a donor and has a carrier density of lower than $8\times10^{11}/cm^3$, preferably lower than $1\times10^{11}/cm^3$, further preferably lower than $1\times10^{10}/cm^3$ and higher than or equal to $1\times10^{-9}/cm^3$.

<Structure of Oxide Semiconductor>

Next, a structure of an oxide semiconductor will be described.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor. Examples of a non-single-crystal oxide semiconductor include a c-axis-aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is an oxide semiconductor film having a plurality of c-axis-aligned crystal parts.

When a combined analysis image (also referred to as high-resolution TEM image) of a bright-field image and a diffraction pattern of the CAAC-OS film is observed with a transmission electron microscope (TEM), a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an InGaZnO$_4$ crystal, is subjected to structural analysis by an out-of-plane method with an X-ray diffraction (XRD) apparatus, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in the CAAC-OS film. It is preferred that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film may serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Charge trapped by the carrier traps in the oxide semiconductor film requires a long time to be released and might behave like fixed charge. Thus, the transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of the microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. For example, in a high-resolution TEM image of the nc-OS film, a grain boundary is not clearly observed in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, the nc-OS film cannot be distinguished from an amorphous oxide semiconductor film by some analysis methods. For example, when the nc-OS film is subjected to structural analysis by an out-of-plane method with an XRD apparatus using an X-ray having a diameter larger than the size of a crystal part, a peak showing a crystal plane does not appear. A diffraction pattern like a halo pattern appears in a selected-area electron diffraction pattern of the nc-OS film obtained by using an electron beam having a probe diameter larger than the size of a crystal part (e.g., having a probe diameter of 50 nm or larger). Meanwhile, spots are observed in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown or a plurality of spots is shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on the lattice fringes in the high-resolution TEM image, each of the lattice fringes having a distance therebetween of 0.28 nm to 0.30 nm corresponds to the a-b plane of the InGaZnO$_4$ crystal.

The density of an oxide semiconductor film varies with its structure in some cases. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal InGaZnO$_4$ with a rhombohedral crystal structure is 6.357 g/cm$^3$. Thus, for example, the density of an a-like OS film with an atomic ratio of In:Ga:Zn=1:1:1 is higher than or equal to 5.0 g/cm$^3$ and lower than 5.9 g/cm$^3$. Moreover, for example, the density of an nc-OS film or a CAAC-OS film with an atomic ratio of In:Ga:Zn=1:1:1 is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve extremely favorable off-state current characteristics.

Embodiment 4

In this embodiment, examples of a layout diagram of the memory cell MC, a circuit diagram and a schematic cross-sectional view that correspond to the layout diagram, and a schematic view showing layouts of layers will be described with reference to FIGS. 11A and 11B, FIG. 12, and FIG. 13.

Figure 11A:
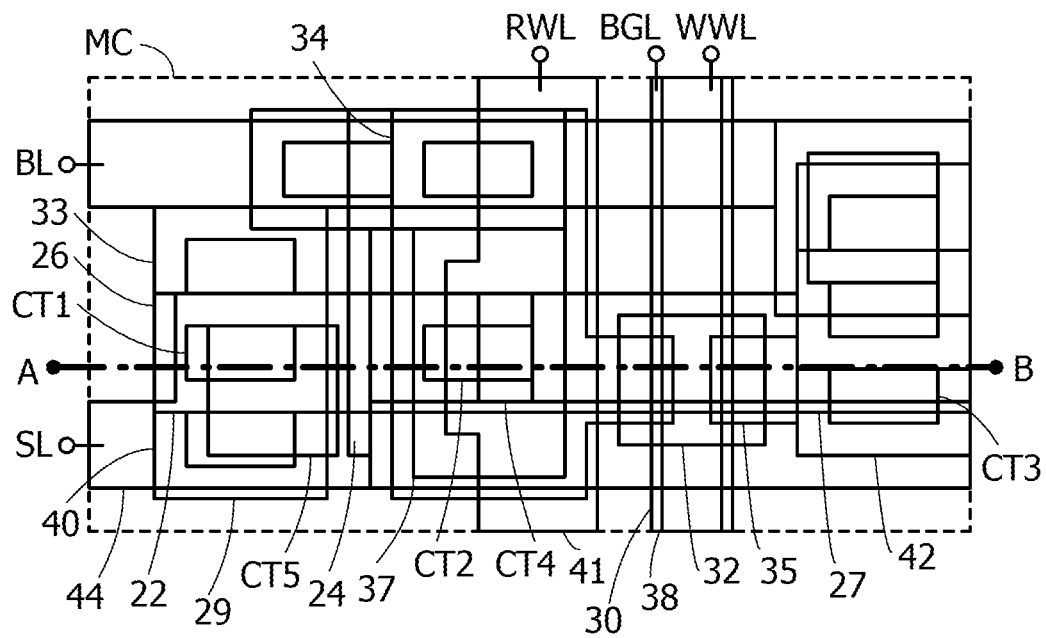
FIGS. 11A and 11B are a top view and a circuit diagram illustrating one embodiment of the present invention.
Figure 11B:
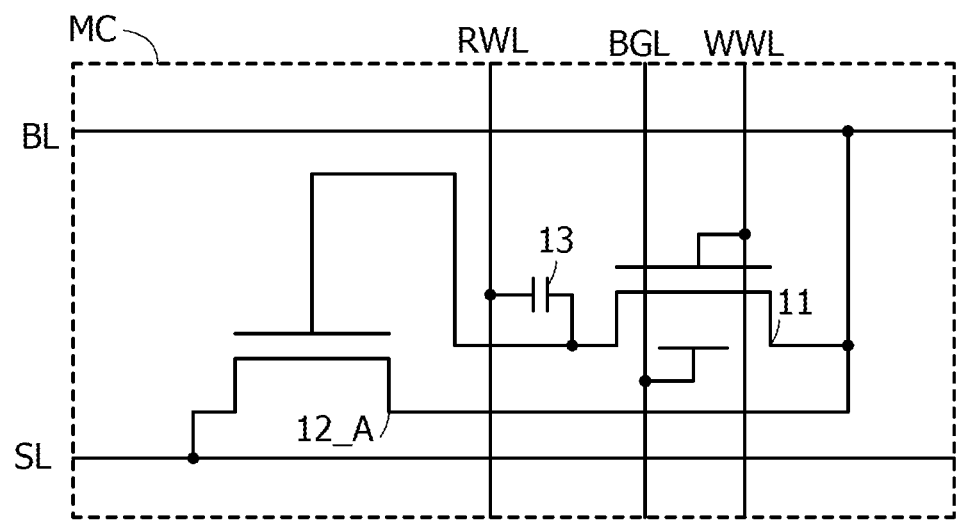
Figure 12:
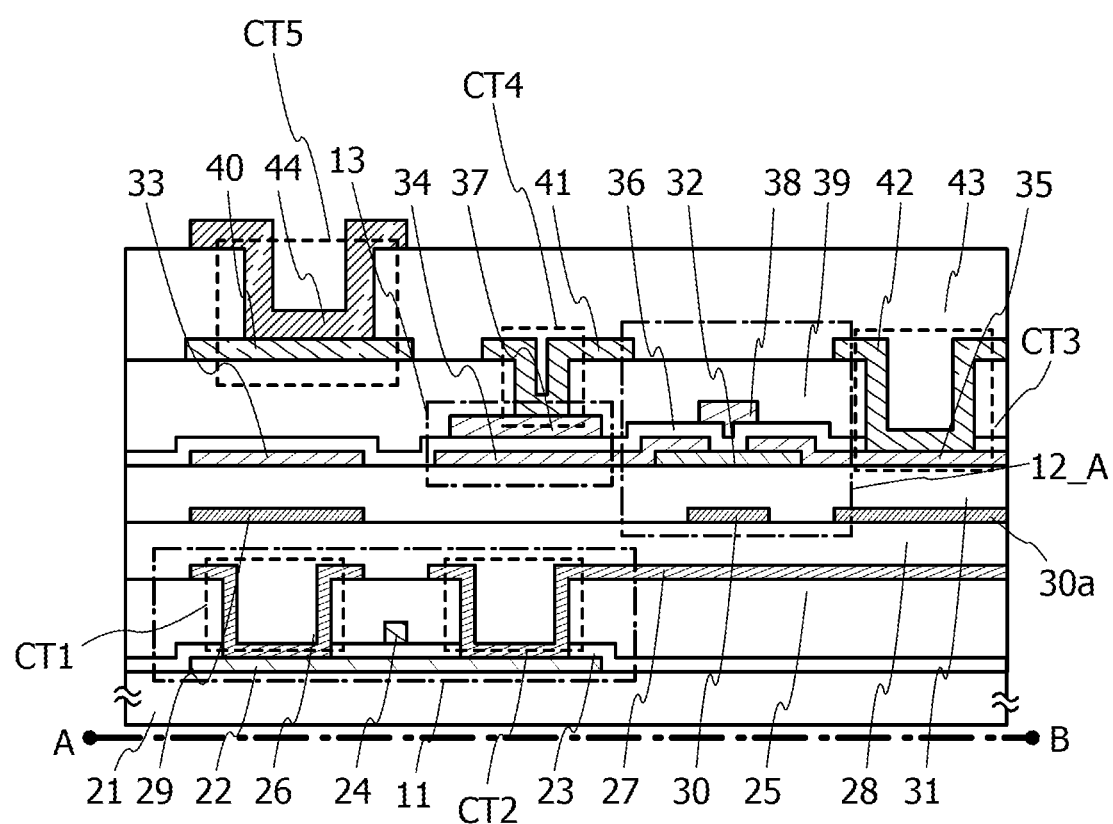
FIG. 12 is a schematic cross-sectional view illustrating one embodiment of the present invention.
Figure 13:
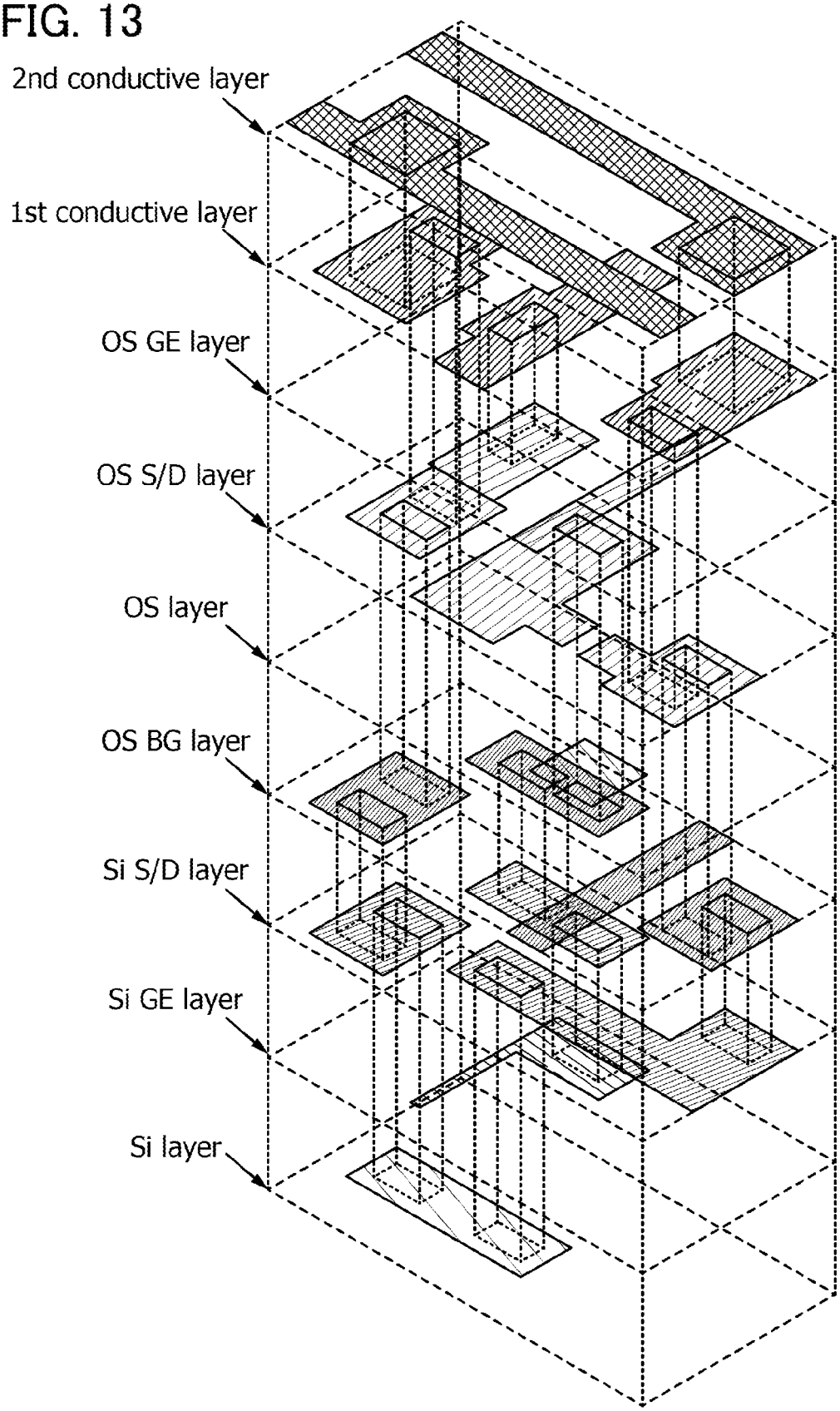
FIG. 13 is a schematic view illustrating one embodiment of the present invention.

FIG. 11A is a layout diagram of the memory cell MC. FIG. 11B is a circuit diagram corresponding to the layout diagram of FIG. 11A. The circuit diagram of FIG. 11B corresponds to that of FIG. 9B. FIG. 12 is a schematic cross-sectional view along dashed-dotted line A-B in FIG. 11A. FIG. 13 is a schematic view illustrating the layer layout corresponding to the schematic cross-sectional view of FIG. 12.

FIG. 11A and FIG. 12 illustrate a substrate 21, a semiconductor layer 22, an insulating layer 23, a conductive layer 24, an insulating layer 25, a conductive layer 26, a conductive layer 27, an insulating layer 28, a conductive layer 29, a conductive layer 30, a conductive layer 30a, an insulating layer 31, a semiconductor layer 32, a conductive layer 33, a conductive layer 34, a conductive layer 35, an insulating layer 36, a conductive layer 37, a conductive layer 38, an insulating layer 39, a conductive layer 40, a conductive layer 41, a conductive layer 42, an insulating layer 43, a conductive layer 44, and openings CT1 to CT5.

The substrate 21 can be, for example, a single crystal silicon substrate (including a p-type semiconductor substrate or an n-type semiconductor substrate), a compound semiconductor substrate containing silicon carbide or gallium nitride, a silicon on insulator (SOI) substrate, or a glass substrate.

An amorphous semiconductor, a microcrystalline semiconductor, a polycrystalline semiconductor, or the like can be used for the semiconductor layers 22 and 32. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In particular, the semiconductor layer 32 is preferably an oxide semiconductor with a single-layer or multilayer structure. The oxide semiconductor used here is an oxide containing at least indium, gallium, and zinc and can be an In—Ga—Zn-based oxide (IGZO). Note that the In—Ga—Zn-based oxide refers to an oxide containing In, Ga, and Zn and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an atomic layer deposition (ALD) method, an evaporation method, a coating method, or the like.

A metal material such as aluminum, copper, titanium, tantalum, or tungsten is preferably used for each of the conductive layers 24, 26, 27, 29, 30, 30a, 33, 34, 35, 37, 38, 40, 41, 42, and 44. Alternatively, polycrystalline silicon to which an impurity such as phosphorus is added can be used. As the formation method, a variety of film formation methods such as an evaporation method, a plasma-enhanced chemical vapor deposition (PECVD) method, a sputtering method, and a spin coating method can be used.

Each of the insulating layers 23, 25, 28, 31, 36, 39, and 43 is preferably a single layer or a multilayer including an inorganic insulating layer or an organic insulating layer. The inorganic insulating layer is preferably a single layer or a multilayer formed using a silicon nitride film, a silicon oxynitride film, a silicon nitride oxide film, or the like. The organic insulating layer is preferably a single layer or a multilayer formed using a polyimide, an acrylic resin, or the like. There is no particular limitation on a method for forming each of the insulating layers; for example, a sputtering method, a molecular beam epitaxy (MBE) method, a PECVD method, a pulse laser deposition method, or an ALD method can be employed as appropriate.

When an oxide semiconductor is used for the semiconductor layer 32, each of the insulating layers 31 and 36 in contact with the semiconductor layer 32 is preferably a single or multilayer inorganic insulating layer. More preferably, the insulating layers 31 and 36 have an effect of supplying oxygen to the semiconductor layer 32.

The openings CT1 and CT2 are provided in the insulating layers 23 and 25 in order to connect the conductive layers 26 and 27 to the semiconductor layer 22 directly. The opening CT3 is provided in the insulating layers 36 and 39 in order to connect the conductive layer 35 and the conductive layer 42 directly. The opening CT4 is provided in the insulating layer 39 in order to connect the conductive layer 37 and the conductive layer 41 directly. The opening CT5 is provided in the insulating layer 43 in order to connect the conductive layer 40 and the conductive layer 44 directly.

FIG. 13 separately illustrates the conductive layers and the semiconductor layers in the layout diagram of the memory cell MC in FIG. 11A and the schematic cross-sectional view along dashed-dotted line A-B in FIG. 11A. FIG. 13 also shows the openings for connecting conductive layers to each other and for connecting the conductive layer and the semiconductor layer.

In FIG. 13, a layout of the semiconductor layer 22 and a semiconductor layer formed at the same level is denoted by "Si layer"; a layout of the conductive layer 24 and a conductive layer formed at the same level, by "Si GE layer"; a layout of the conductive layers 26 and 27 and a conductive layer formed at the same level, by "Si S/D layer"; a layout of the conductive layers 29, 30, and 30a and a conductive layer formed at the same level, by "OS BG layer"; a layout of the semiconductor layer 32 and a semiconductor layer formed at the same level, by "OS layer"; a layout of the conductive layers 33, 34, and 35 and a conductive layer formed at the same level, by "OS S/D layer"; a layout of the conductive layers 37 and 38 and a conductive layer formed at the same level, by "OS GE layer"; a layout of the conductive layers 40, 41, and 42 and a conductive layer formed at the same level, by "1st conductive layer"; and a layout of the conductive layer 44 and a conductive layer formed at the same level, by "2nd conductive layer."

As shown in the layout diagram of FIG. 11A, the conductive layers 34 and 35 in contact with the semiconductor layer 32 are preferably provided not to completely cover edges of the semiconductor layer 32 that are parallel to the channel width direction. This structure reduces the area where the conductive layers 34 and 35 overlap with the conductive layers 30 and 38, thereby reducing parasitic capacitance between the conductive layers. Thus, it is possible to suppress a change in potential of the conductive layers 34 and 35 due to a change in potential of the conductive layers 30 and 38.

Embodiment 5

Although the conductive layer and the semiconductor layer described in the above embodiments can be formed by a sputtering method, they may be formed by another method, for example, a thermal CVD method. Examples of a thermal CVD method include a metal organic chemical vapor deposition (MOCVD) method and an ALD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and the source gas and the oxidizer are reacted with each other in the vicinity of a substrate or over the substrate.

In an ALD method, deposition is performed in such a manner that the pressure in a chamber is set to an atmospheric pressure or a reduced pressure, source gases for reaction are sequentially introduced into the chamber and reacted, and then the sequence of the gas introduction is repeated. An inert gas (e.g., argon or nitrogen) may be introduced as a carrier gas with the source gases. Two or more kinds of source gases may be sequentially supplied to the chamber. In this case, after the reaction of a first source gas, an inert gas is introduced, and then a second source gas is introduced so that the source gases are not mixed. Alternatively, the second source gas may be introduced after the first source gas is exhausted by vacuum evacuation instead of the introduction of the inert gas. The first source gas is adsorbed on the surface of a substrate and reacted to form a first layer, and then, the second source gas introduced subsequently is absorbed and reacted; as a result, a second layer is stacked over the first layer and thus, a thin film is formed. The sequence of the gas introduction is repeated multiple times until a desired thickness is obtained, whereby a thin film with excellent step coverage can be formed. The thickness of the thin film can be adjusted by the number of repetitions of the gas introduction; therefore, an ALD method makes it possible to accurately adjust a thickness and thus is suitable for manufacturing a minute FET.

The conductive film and the semiconductor film described in the above embodiments can be formed by a thermal CVD method such as an MOCVD method or an ALD method. For example, trimethylindium ($In(CH_3)_3$), trimethylgallium ($Ga(CH_3)_3$), and dimethylzinc ($Zn(CH_3)_2$) are used to form an In—Ga—Zn—O film. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, when a tungsten film is formed using a deposition apparatus employing ALD, a $WF_6$ gas and a $B_2H_6$ gas are sequentially introduced to form an initial tungsten film, a $WF_6$ gas and an $H_2$ gas are sequentially introduced, and the latter process is repeated so that a tungsten film is formed. Note that a $SiH_4$ gas may be used instead of a $B_2H_6$ gas.

For example, when an oxide semiconductor film, e.g., an In—Ga—Zn—O film is formed using a deposition apparatus employing ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed oxide layer such as an In—Ga—O layer, an In—Zn—O layer, or a Ga—Zn—O layer may be formed by mixing of these gases. Although an $H_2O$ gas obtained by bubbling with an inert gas such as Ar may be used instead of an $O_3$ gas, it is preferable to use an $O_3$ gas, which does not contain H.

Embodiment 6

In this embodiment, application examples of the semiconductor device described in the foregoing embodiments to an electronic component and to an electronic device including the electronic component will be described with reference to FIGS. 14A and 14B and FIGS. 15A to 15E.

Figure 14A:
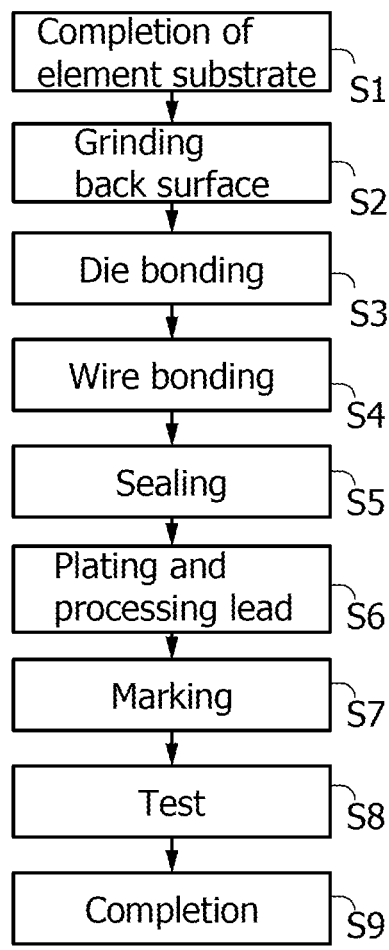
FIGS. 14A and 14B are a flowchart and a perspective view illustrating one embodiment of the present invention.

FIG. 14A shows an example where the semiconductor device described in the foregoing embodiment is used to prepare an electronic component. Note that an electronic component is also referred to as semiconductor package or IC package. For the electronic component, there are various standards and names corresponding to the direction or the shape of terminals; hence, one example of the electronic component will be described in this embodiment.

A semiconductor device including transistors as illustrated in FIGS. 11A and 11B, FIG. 12, and FIG. 13 of Embodiment 4 is completed by integrating detachable components on a printed circuit board through the assembly process (post-process).

The post-process can be completed through steps shown in FIG. 14A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as determined as appropriate by products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device described in the foregoing embodiment, it is possible to obtain a highly reliable electronic component.

Figure 14B:
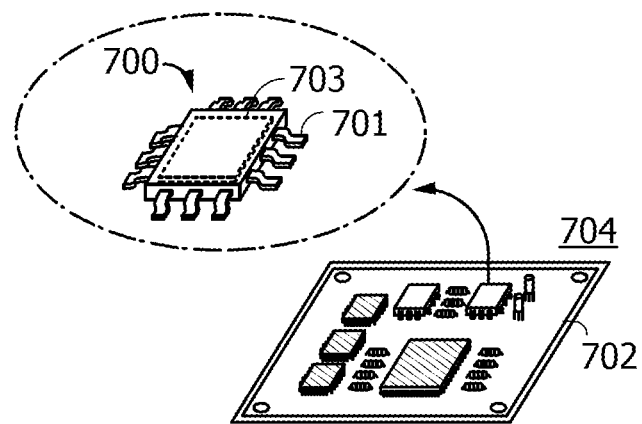

FIG. 14B is a schematic perspective view of a completed electronic component. FIG. 14B shows a schematic perspective view of a quad flat package (QFP) as an example of the electronic component. An electronic component 700 illustrated in FIG. 14B includes a lead 701 and a circuit portion 703. The electronic component 700 in FIG. 14B is mounted on a printed circuit board 702, for example. A combination of electronic components 700 electrically connected to each other over the printed circuit board 702 can be equipped in an electronic device. A completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 15A:
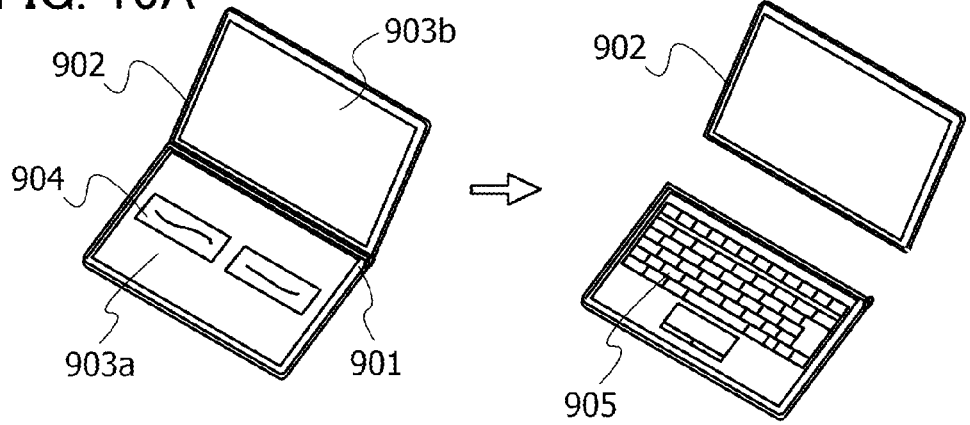
FIGS. 15A to 15E each illustrate an electronic device to which one embodiment of the present invention can be applied.

FIG. 15A illustrates a portable information appliance that includes a housing 901, a housing 902, a first display portion 903a, a second display portion 903b, and the like. At least one of the housings 901 and 902 is provided with the semiconductor device of the foregoing embodiment. It is thus possible to obtain a highly reliable portable information appliance.

Note that the first display portion 903a is a panel having a touch input function, and for example, as illustrated in the left of FIG. 15A, operation via "touch input" or "keyboard input" can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 15A. Thus, letters can be input quickly by key input as in a conventional information appliance, for example.

One of the first display portion 903a and the second display portion 903b can be detached from the portable information appliance as shown in the right of FIG. 15A. Providing the second display portion 903b with a touch input function makes the information appliance convenient to carry because a weight to carry around can be further reduced and the information appliance can operate with one hand while the other hand supports the housing 902.

The portable information appliance in FIG. 15A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 15A may be configured to transmit and receive data wirelessly. Through wireless communication, desired book data or the like can be purchased and downloaded from an e-book server.

In addition, the housing 902 illustrated in FIG. 15A may be equipped with an antenna, a microphone function, and a wireless communication function to be used as a mobile phone.

Figure 15B:
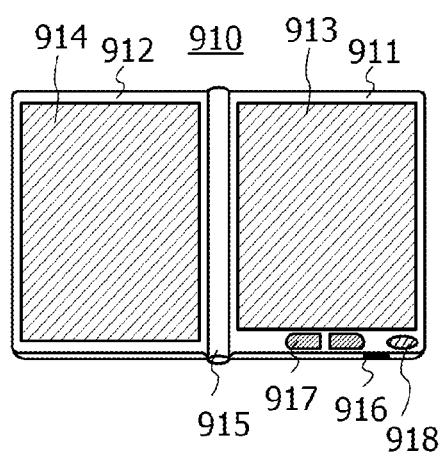

FIG. 15B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The semiconductor device of the foregoing embodiment is provided in at least one of the housings 911 and 912. It is thus possible to obtain a highly reliable e-book reader.

Figure 15C:
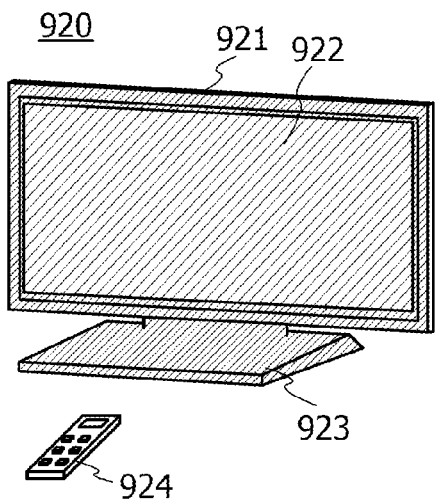

FIG. 15C illustrates a television device 920 including a housing 921, a display portion 922, a stand 923, and the like. The television device 920 can be controlled by a switch of the housing 921 and a separate remote controller 924. The semiconductor device of the foregoing embodiment is provided in the housing 921 and the remote controller 924. Consequently, it is possible to obtain a highly reliable television device.

Figure 15D:
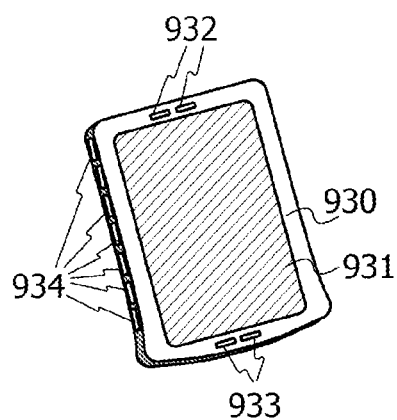

FIG. 15D illustrates a smartphone in which a main body 930 is provided with a display portion 931, a speaker 932, a microphone 933, operation buttons 934, and the like. The semiconductor device of the foregoing embodiment is provided in the main body 930. It is thus possible to obtain a highly reliable smartphone.

Figure 15E:
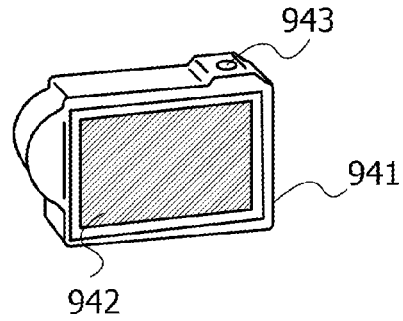

FIG. 15E illustrates a digital camera including a main body 941, a display portion 942, an operation switch 943, and the like. The semiconductor device of the foregoing embodiment is provided in the main body 941. Thus, it is possible to obtain a highly reliable digital camera.

As described above, the electronic device shown in this embodiment includes the semiconductor device of the foregoing embodiment, thereby having high reliability.

(Supplementary Notes on Description in this Specification and the Like)

The following are notes on the description of Embodiments 1 to 6 and the structures in Embodiments 1 to 6.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

One embodiment of the present invention is not limited to those described in Embodiments 1 to 6. For example, in Embodiment 1, a structure using an OS transistor as a transistor with a low off-state current is described as one embodiment of the present invention; however, one embodiment of the present invention is not limited to using an OS transistor as long as a transistor with a low off-state current is used. Accordingly, for example, a structure without an OS transistor may be one embodiment of the present invention under some circumstances.

<Notes on Description for Drawings>

In this specification and the like, terms for describing arrangement, such as "over" and "under", are used for convenience to indicate a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as plan view or layout view) and a perspective view, some of components might not be illustrated for clarity of the drawings.

<Notes on Expressions that can be Rephrased>

In this specification and the like, the terms "one of a source and a drain" (or first electrode or first terminal) and "the other of the source and the drain" (or second electrode or second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

<Notes on Definitions of Terms>

The following are definitions of the terms that are not mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source and a drain of the transistor are regarded as being electrically short-circuited. Furthermore, the "off state" of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch formed using a microelectromechanical system (MEMS) technology, such as a digital micromirror device (DMD). Such a switch includes an electrode that can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. That is, the channel length of one transistor is not limited to one value in some cases. Therefore, in this specification, the channel length is any one of lengths, the maximum length, the minimum length, or the average length in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

In one transistor, channel widths in all regions are not necessarily the same. That is, the channel width of one transistor is not fixed to one value in some cases. Therefore, in this specification, a channel width is any one of widths, the maximum width, the minimum width, or the average width in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is sometimes high. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

In view of this, in a top view of a transistor in this specification, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width or an apparent channel width, or may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one when an effective channel width is used for the calculation is obtained in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

This application is based on Japanese Patent Application serial No. 2014-247725 filed with Japan Patent Office on Dec. 8, 2014, the entire contents of which are hereby incorporated by reference.

What is claimed is:

1. A semiconductor device comprising:
 a memory cell comprising a first transistor;
 a row driver and a column driver electrically connected to the memory cell;
 a write voltage generator circuit between the column driver and the memory cell; and
 a wiring electrically connected to the memory cell and the write voltage generator circuit,
 wherein the memory cell is configured to control writing or retention of data corresponding to one of a plurality of potentials by controlling an on/off state of the first transistor,
 wherein the write voltage generator circuit is configured to output a first write voltage of data to be written to the memory cell through the wiring,
 wherein the write voltage generator circuit is configured to obtain a read voltage of the wiring, and
 wherein the write voltage generator circuit is configured to generate a second write voltage by correcting the first write voltage that is changed when the first transistor is turned off, and outputting the second write voltage to the memory cell through the wiring, and wherein the first write voltage is different from the read voltage.

2. The semiconductor device according to claim 1,
wherein the memory cell further comprises a second transistor,
wherein a gate of the second transistor is electrically connected to one of a source and a drain of the first transistor,
wherein the first write voltage and the second write voltage are written through the first transistor and the second transistor to a node,
wherein the gate of the second transistor and the one of the source and the drain of the first transistor are electrically connected to the node, and
wherein the read voltage is read from the node through the first transistor and the second transistor.

3. The semiconductor device according to claim 2, wherein the second transistor comprises silicon in a channel formation region.

4. The semiconductor device according to claim 1, wherein the first transistor comprises an oxide semiconductor in a channel formation region.

5. The semiconductor device according to claim 1, wherein the read voltage is read without precharging a wiring varying in potential.

6. An electronic device comprising:
the semiconductor device according to claim 1; and
a display portion.

7. A semiconductor device comprising:
a memory cell comprising a first transistor;
a row driver and a column driver electrically connected to the memory cell;
a write voltage generator circuit between the column driver and the memory cell; and
a wiring electrically connected to the memory cell and the write voltage generator circuit,
wherein the memory cell is configured to control writing or retention of data corresponding to one of a plurality of potentials by controlling an on/off state of the first transistor,
wherein the write voltage generator circuit is configured to output a first write voltage of data to be written to the memory cell through the wiring,
wherein the write voltage generator circuit is configured to obtain a read voltage of the wiring, and
wherein the write voltage generator circuit is configured to generate a second write voltage by adding a potential of difference between the first write voltage and the read voltage to the first write voltage, and outputting the second write voltage to the memory cell through the wiring, and
wherein the first write voltage is different from the read voltage.

8. The semiconductor device according to claim 7,
wherein the memory cell further comprises a second transistor,
wherein a gate of the second transistor is electrically connected to one of a source and a drain of the first transistor,
wherein the first write voltage and the second write voltage are written through the first transistor and the second transistor to a node,
wherein the gate of the second transistor and the one of the source and the drain of the first transistor are electrically connected to the node, and
wherein the read voltage is read from the node through the first transistor and the second transistor.

9. The semiconductor device according to claim 8, wherein the second transistor comprises silicon in a channel formation region.

10. The semiconductor device according to claim 7, wherein the first transistor comprises an oxide semiconductor in a channel formation region.

11. The semiconductor device according to claim 7, wherein the read voltage is read without precharging a wiring varying in potential.

12. An electronic device comprising:
the semiconductor device according to claim 7; and
a display portion.

13. A semiconductor device comprising:
a memory cell comprising a first transistor;
a row driver and a column driver electrically connected to the memory cell;
a write voltage generator circuit between the column driver and the memory cell; and
a wiring electrically connected to the memory cell and the write voltage generator circuit,
wherein the memory cell is configured to control writing or retention of data corresponding to one of a plurality of potentials by controlling an on/off state of the first transistor,
wherein the write voltage generator circuit is configured to output a first write voltage of data to be written to the memory cell through the wiring,
wherein the write voltage generator circuit is configured to obtain a read voltage of the wiring, and
wherein the write voltage generator circuit is configured to generate a second write voltage by adding, to the first write voltage, a voltage for correction corresponding to a result of comparison between the read voltage with a reference voltage, and outputting the second write voltage to the memory cell through the wiring, and
wherein the first write voltage is different from the read voltage.

14. The semiconductor device according to claim 13,
wherein the memory cell further comprises a second transistor,
wherein a gate of the second transistor is electrically connected to one of a source and a drain of the first transistor,
wherein the first write voltage and the second write voltage are written through the first transistor and the second transistor to a node,
wherein the gate of the second transistor and the one of the source and the drain of the first transistor are electrically connected to the node, and
wherein the read voltage is read from the node through the first transistor and the second transistor.

15. The semiconductor device according to claim 14, wherein the second transistor comprises silicon in a channel formation region.

16. The semiconductor device according to claim 13, wherein the first transistor comprises an oxide semiconductor in a channel formation region.

17. The semiconductor device according to claim 13, wherein the read voltage is read without precharging a wiring varying in potential.

18. An electronic device comprising:
the semiconductor device according to claim 13; and
a display portion.

* * * * *